(12) United States Patent
Hagiwara et al.

(10) Patent No.: US 7,081,946 B2
(45) Date of Patent: Jul. 25, 2006

(54) HOLDING APPARATUS, HOLDING METHOD, EXPOSURE APPARATUS AND DEVICE MANUFACTURING METHOD

(75) Inventors: Tsuneyuki Hagiwara, Tokyo (JP); Hiromitsu Yoshimoto, Kumagaya (JP); Hiroto Horikawa, Kumagaya (JP); Hideo Mizutani, Yokohama (JP)

(73) Assignee: Nikon Corporation, Tokyo (JP)

( * ) Notice: Subject to any disclaimer, the term of this patent is extended or adjusted under 35 U.S.C. 154(b) by 179 days.

(21) Appl. No.: 10/639,651

(22) Filed: Aug. 13, 2003

(65) Prior Publication Data

US 2004/0100624 A1    May 27, 2004

Related U.S. Application Data

(63) Continuation of application No. PCT/JP02/01200, filed on Feb. 13, 2002.

(30) Foreign Application Priority Data

Feb. 13, 2001    (JP)    ............................ P2001-036130

(51) Int. Cl.
*G03B 27/32* (2006.01)
*G03B 27/42* (2006.01)

(52) U.S. Cl. ............................ 355/53; 355/72; 355/75; 355/77

(58) Field of Classification Search ................ 355/72, 355/73, 75, 76, 77

See application file for complete search history.

(56) References Cited

U.S. PATENT DOCUMENTS

| | | | | |
|---|---|---|---|---|
| 4,425,038 A | * | 1/1984 | La Fiandra et al. | 355/73 |
| 4,522,489 A | * | 6/1985 | Bouwer | 355/73 |
| 5,534,073 A | * | 7/1996 | Kinoshita et al. | 118/728 |
| 5,563,683 A | * | 10/1996 | Kamiya | 355/53 |
| 5,564,682 A | * | 10/1996 | Tsuji | 269/21 |
| 6,032,997 A | * | 3/2000 | Elliott et al. | 294/64.1 |

FOREIGN PATENT DOCUMENTS

| | | |
|---|---|---|
| JP | 4-289864 A | 10/1992 |
| JP | 9-82606 A | 3/1997 |
| JP | 11-135412 A | 5/1999 |

\* cited by examiner

*Primary Examiner*—Rodney Fuller
(74) *Attorney, Agent, or Firm*—Oliff & Berridge PLC

(57) ABSTRACT

A reticle holder 18 has; a first suction section 63 facing a precision warrantable area AR1 having a predetermined surface precision, of a lower face Ra of a reticle R; a second suction section 64 facing a precision unwarrantable area AR2 outside of the precision warrantable area AR1; a pore 70*a* connected to a suction apparatus which draws out gas in a space between the lower face Ra of the reticle R and the first suction section 63, and a pore 70*b* connected to the suction apparatus 72 which draws out gas in the space between the lower face Ra of the reticle R and the second suction section 64. As a result, the reticle can be held stably, without deteriorating the surface precision of the precision warrantable area.

45 Claims, 22 Drawing Sheets

FIG. 8

| L(mm) | H=4μm | H=3μm | H=2μm | H=1μm |
|---|---|---|---|---|
| 11 | $2.54 \times 10^{-3}$ | $2.52 \times 10^{-3}$ | $2.11 \times 10^{-3}$ | $1.89 \times 10^{-3}$ |
| 10 | $1.94 \times 10^{-3}$ | $1.94 \times 10^{-3}$ | $1.94 \times 10^{-3}$ | $1.94 \times 10^{-3}$ |
| 9 | $1.94 \times 10^{-3}$ | $1.94 \times 10^{-3}$ | $1.94 \times 10^{-3}$ | $1.78 \times 10^{-3}$ |
| 8 | $1.94 \times 10^{-3}$ | $1.91 \times 10^{-3}$ | $1.44 \times 10^{-3}$ | $8.92 \times 10^{-4}$ |
| 7 | $5.16 \times 10^{-4}$ | $5.16 \times 10^{-4}$ | $5.16 \times 10^{-4}$ | $5.16 \times 10^{-4}$ |
| 6 | $5.15 \times 10^{-4}$ | $5.15 \times 10^{-4}$ | $5.15 \times 10^{-4}$ | $5.15 \times 10^{-4}$ |
| 5 | $8.49 \times 10^{-5}$ | $8.59 \times 10^{-5}$ | $8.59 \times 10^{-5}$ | $8.59 \times 10^{-5}$ |
| 4 | $8.49 \times 10^{-5}$ | $8.59 \times 10^{-5}$ | $8.59 \times 10^{-5}$ | $8.46 \times 10^{-5}$ |
| 3 | $8.50 \times 10^{-5}$ | $8.59 \times 10^{-5}$ | $8.59 \times 10^{-5}$ | $8.46 \times 10^{-5}$ |
| 2 | $3.49 \times 10^{-6}$ | $5.59 \times 10^{-6}$ | $2.10 \times 10^{-6}$ | $2.10 \times 10^{-6}$ |

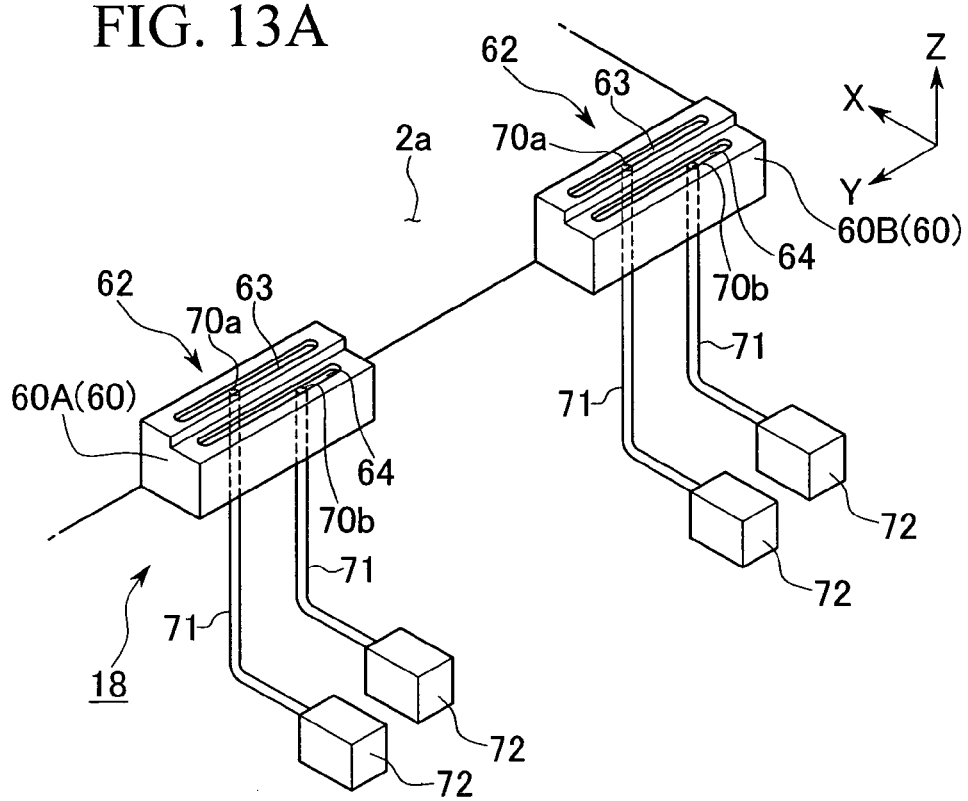
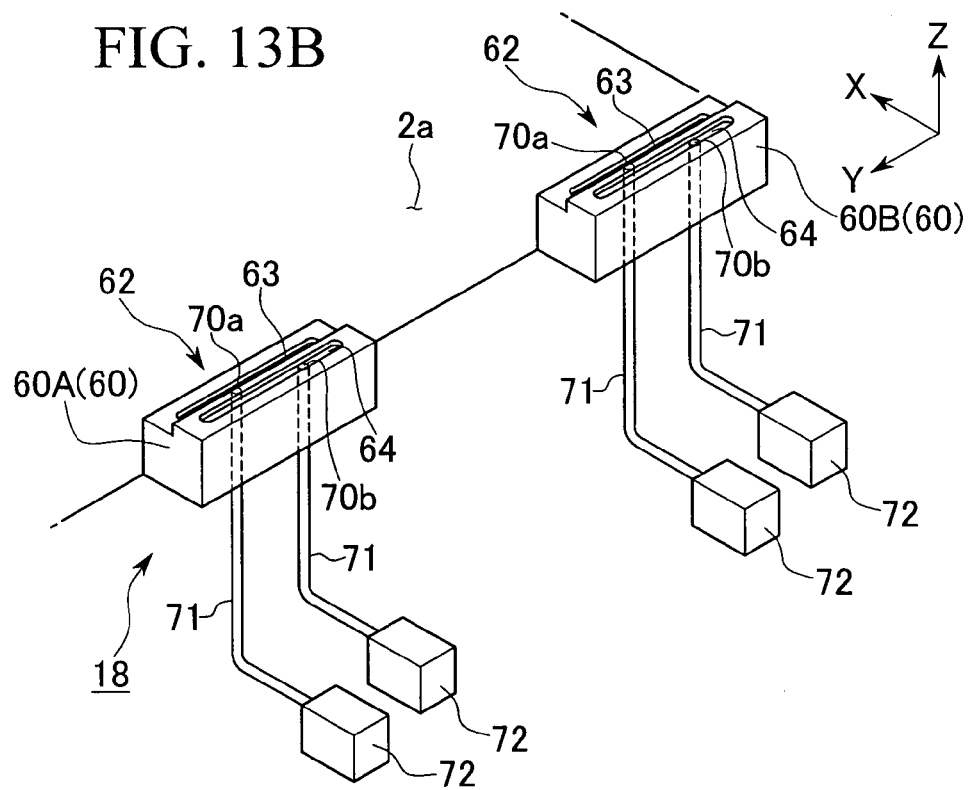

FIG. 23
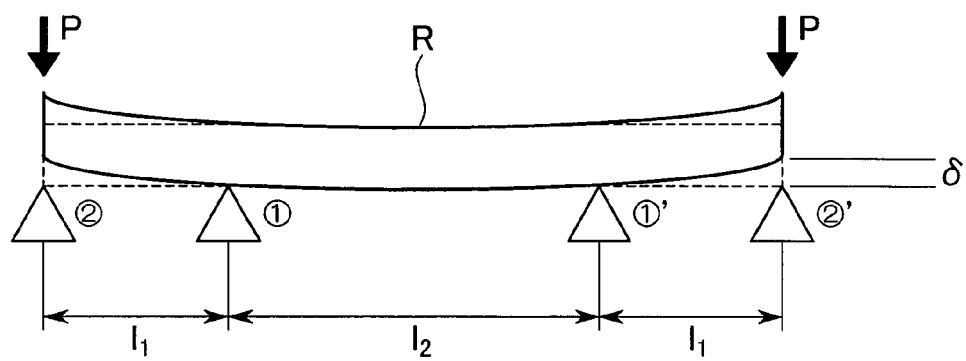
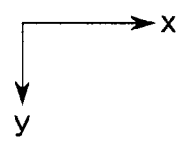
FIG. 24
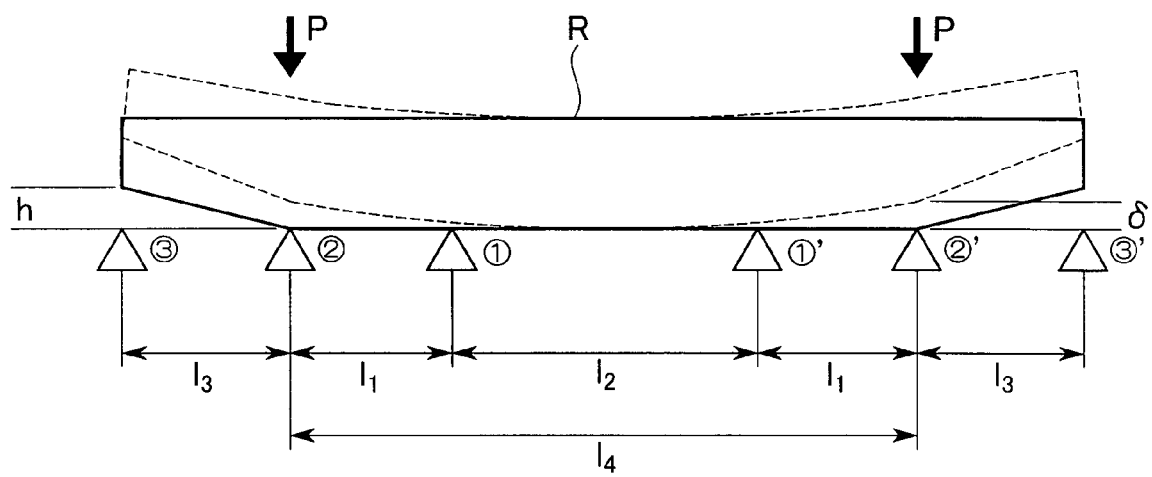
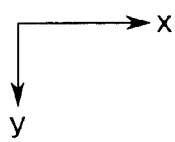

HOLDING APPARATUS, HOLDING METHOD, EXPOSURE APPARATUS AND DEVICE MANUFACTURING METHOD

This application is a continuation of PCT/JP02/01200 filed on Feb. 13, 2002, and priority is claimed under 35 U.S.C. §119 to Japanese patent application No. 2001-036130 filed on Feb. 13, 2001, which is incorporated herein by reference.

BACKGROUND OF THE INVENTION

1. Field of the Invention

The present invention relates to a holding apparatus and a holding method, and an exposure apparatus which uses a mask and a substrate held by the holding apparatus to expose a mask pattern onto the substrate. More specifically, the present invention relates to a holding apparatus and a holding method, an exposure apparatus and a device manufacturing method, suitable for use in a lithography process, particularly when devices such as liquid crystal display elements and semiconductor elements are manufactured.

2. Background Art

In the lithography process, being one of the manufacturing processes for semiconductor devices, various kinds of exposure apparatus have been used, which transfer a circuit pattern formed on a mask or a reticle (hereinafter referred to as a "reticle") onto a substrate such as a wafer or a glass plate, to which a resist (photosensitizer) has been applied. For example, as an exposure apparatus for semiconductor devices, a reduced size projection exposure apparatus is mainly used, which transfers the reticle pattern onto the wafer while reducing the size of the pattern, using a projection optical system, corresponding to the miniaturization of the minimum line width of the pattern (device rule) accompanying recent high integration of integrated circuits.

In the above described exposure apparatus, when the reticle pattern is transferred onto the wafer, the reticle is held on a reticle holder by vacuum attraction. As a conventional example of such a reticle holder, there is one shown in FIG. 26. FIG. 26 is a perspective view illustrating a reticle holder for holding a reticle. As shown in this figure, the reticle holder 100 comprises an opening 102 formed at the center, seat portions 104 provided at a plurality of positions (three places) on the upper face, and suction pads 106 respectively provided on the upper faces of the seat portions 104. The reticle holder 100 is provided so as to be movable two-dimensionally in XY directions with respect to a base 110. The suction pads 106 are provided at positions facing the lower face of the reticle R, and connected to a compressor (suction apparatus) which is not shown. The compressor draws out gas in the space between the lower face of the reticle R and the suction pads 106 to make the pressure in the space between the lower face of the reticle R and the suction pads 106 lower than the outside pressure, so that the reticle R is attracted and held by the reticle holder 100.

The reticle R has a pattern at the center on the lower face, and a pellicle PE for protecting a pattern face is provided on the pattern face (that is, the central part on the lower face of the reticle R). Therefore, the reticle holder 100 should attract and hold the portions of the lower face of the reticle, except of the portion where the pellicle PE is provided.

It is preferable that the contact surface between the suction pads 106 of the reticle holder 100 and the reticle R is large, in order that the reticle holder 100 stably holds the reticle R. However, as described above, the size (area) of the face of the reticle R which is attracted by the reticle holder 100 is restricted by the pellicle PE. If it is tried to attract and hold a wide area of the portion other than the pellicle PE, on the lower face of the reticle R, even an area, which does not have a predetermined surface precision, for example, an outer peripheral area on the lower face of the reticle R (hereinafter referred to as "precision unwarrantable area") must be attracted and held by the reticle holder 100. In this case, the contact surface of the reticle R with respect to the suction pads 106 is distorted, and this distortion affects even the area having predetermined surface precision (hereinafter referred to as a "precision warrantable area") to decrease the surface precision, thereby causing a problem in that high precision exposure processing cannot be performed.

On the other hand, it can be considered to attract and hold the area in the vicinity of the pellicle PE (hereinafter referred to as an "inside edge area"), being the precision warrantable area, in the portion other than the pellicle PE on the lower face of the reticle R. However, when the reticle holder 100 holds this inside edge area, the reticle holder 100 interferes with a carrier device which loads and unloads the reticle R with respect to the reticle holder 100, which is not desirable. In other words, when the reticle R is loaded or unloaded with respect to the reticle holder 100, a carrier device having a fork portion is used. However, when the reticle R is supported by this fork portion, the fork portion supports the portion other than the pellicle PE on the lower face of the reticle R. When the reticle R is loaded or unloaded with respect to the reticle holder 100 by using this carrier device, the shape or the size of the seat portion 104 of the reticle holder 100, or the position or the size of the suction pads 106 are restricted, in order to prevent interference between the reticle holder 100 and the fork portion, and as a result, the position and size of the surface to which the reticle R is attracted are also restricted.

Moreover, it can be also considered to attract and hold only the precision warrantable area existing in an area where interference with the carrier device does not occur, which is the portion other than the pellicle PE on the lower face of the reticle R. However, in this case, since the surface of the reticle R to be attracted becomes small, the holding power of the reticle holder 100 with respect to the reticle R becomes weak. For example, when the reticle holder 100 is shifted with respect to the base 110 at high speed, there is the possibility that the reticle R on the reticle holder 100 is deviated due to the inertia force. When the surface of the reticle R to be attracted is small, it can be considered to increase the attractive force by the compressor, to increase the holding power with respect to the reticle R. However, in this case, since a local force acts on the reticle R, the reticle R may be distorted.

In view of the above situation, it is an object of the present invention to provide a holding apparatus and a holding method that can hold a reticle (mask) stably, without deteriorating the surface precision in the precision warrantable area, and an exposure apparatus that can perform accurate exposure processing with this holding apparatus, and a device manufacturing method that can manufacture devices highly accurately.

BRIEF SUMMARY OF THE INVENTION

A first aspect of the present invention is a holding apparatus which holds a surface to be attracted of a flat sample. This holding apparatus comprises; a first holding section facing a first area having predetermined surface precision of the surface to be attracted, a second holding section facing a second area other than the first area of the surface to be attracted, and a suction apparatus which draws out gas in spaces between the surface to be attracted and the first and the second holding sections.

The suction apparatus may comprise; a first suction device which draws out gas in a space between the surface to be attracted and the first holding section, and a second suction device which draws out gas in a space between the surface to be attracted and the second holding section.

A second aspect of the present invention is a holding method for holding a surface to be attracted of a flat sample. By this holding method, each of a first area having a predetermined surface precision of the surface to be attracted and a second area other than the first area of the surface to be attracted are attracted and held by a first holding section and a second holding section, respectively and independently.

According to the apparatus and the method described above, the first area having predetermined surface precision of the surface to be attracted and the second area other than the first area of the surface to be attracted are attracted and held by the first holding section and the second holding section, respectively and independently. Accordingly, the first holding section can stably hold the sample, without deteriorating the overall surface precision of the sample, and the second holding section can increase the size of the whole surface of the sample to be attracted. As a result, stable retention can be realized.

Each of the first holding section and the second holding section may be arranged at a plurality of positions with respect to the surface to be attracted. In this case, the sample can be held more stably.

The first holding section and the second holding section may be arranged adjacent to each other, and a boundary portion between the first holding section and the second holding section may be arranged at least in the first area of the sample. In this case, even if the sample deforms to bend, peeling of the sample from the first holding section can be suppressed. As a result, the holding apparatus can stably hold the sample.

The second holding section and the second area of the sample may be set to have a predetermined gap. In this case, the attraction of the second holding section with respect to the second area becomes smaller than that of the first holding section with respect to the first area. Therefore, deformation of the sample resulting from the second holding section attracting the second area with a strong attraction can be suppressed.

The suction amount of the gas per unit time by the first suction device and the suction amount of the gas per unit time by the second suction device may be controlled. In this case, the attraction of the second holding section with respect to the second area can be made smaller than that of the first holding section with respect to the first area, thereby suppressing the deformation of the sample resulting from the second holding section attracting the second area with a strong attraction.

The area of the first holding section with respect to the first area may be set larger than the area of the second holding section with respect to the second area. In this case, since the attraction of the second holding section with respect to the second area can be made less than that of the first holding section with respect to the first area, deformation of the sample resulting from the second holding section attracting the second area with a strong attraction can be suppressed.

A third aspect of the present invention is an exposure apparatus which exposes a pattern of a mask held by a mask holder onto a substrate held by a substrate holder. This exposure apparatus uses the holding apparatus for at least one of the mask holder and the substrate holder.

According to the exposure apparatus of the present invention, the exposure processing can be performed, while stably holding the mask or substrate, with the mask or substrate maintained at predetermined surface precision. As a result, highly accurate exposure processing can be realized.

An other aspect of the present invention is a device manufacturing method incorporating a lithography process, and the exposure apparatus is used in the lithography process.

According to the device manufacturing method of the present invention, since this uses the exposure apparatus which can perform stable exposure processing with high accuracy, with the mask or substrate maintained at predetermined surface precision, high quality devices can be manufactured.

An other aspect of the present invention is a mask holding method for holding a mask in which a surface to be attracted has a convex shape towards a first direction within a predetermined allowable range, with a pair of first attraction holding sections arranged opposing the first direction. In this method, the mask is held so as to satisfy the following relational expression:

$$\delta < Pl_1^2(2l_1+3l_2)/6EI$$

where $l_1$ respectively denotes an interval between a central supporting point and an outside supporting point of the mask in the respective attraction holding sections, $l_2$ denotes an interval between the central supporting points in the respective attraction holding sections, $\delta$ denotes an interval between the mask and the outside supporting point, which is generated when the mask is mounted on the central supporting point, P denotes a product of the atmospheric pressure and an attraction area of the first attraction holding section, E denotes a modulus of longitudinal elasticity of the mask, and I denotes a geometrical moment of inertia of the mask.

An other aspect of the present invention is a mask holding apparatus which holds a mask in which a surface to be attracted has a convex shape towards a first direction within a predetermined allowable range, with a pair of first attraction holding sections arranged opposing the first direction. In this apparatus, the first attraction holding sections are respectively arranged so as to satisfy the following relational expression:

$$\delta < Pl_1^2(2l_1+3l_2)/6EI$$

where $l_1$ respectively denotes an interval between a central supporting point and an outside supporting point of the mask in the respective attraction holding sections, $l_2$ denotes an interval between the central supporting points in the respective attraction holding sections, $\delta$ denotes an interval between the mask and the outside supporting point, which is generated when the mask is mounted on the central supporting point, P denotes a product of the atmospheric pressure and an attraction area of the first attraction holding section, E denotes a modulus of longitudinal elasticity of the mask, and I denotes a geometrical moment of inertia of the mask.

According to the method and apparatus described above, the first attraction holding sections can hold the mask stably, without deteriorating the overall surface precision of the mask, and increase the size of the whole surface of the mask to be attracted. As a result, stable mask retention can be realized.

BRIEF DESCRIPTION OF THE DRAWINGS

FIGS. 5A and 5B are schematic diagrams illustrating a state with a mask held by the holding apparatus of the present invention, wherein FIG. 5A is a top view and FIG. 5B is a sectional view as seen in the direction of arrows A—A.

FIG. 8 is a table showing the relation between the size and interval of a second area and a maximum deflection of the mask.

FIGS. 11 to 14 are enlarged perspective views of the main part in other embodiments of the holding apparatus of the present invention.

FIGS. 22 to 24 are sectional views of a reticle for explaining the effects of other embodiments of the present invention.

DETAILED DESCRIPTION OF THE INVENTION

Hereunder is a description of preferred embodiments of the present invention, with reference to the drawings. However, the present invention is not limited to the respective embodiments, and for example, the components in these embodiments may be appropriately combined.

Figure 1:
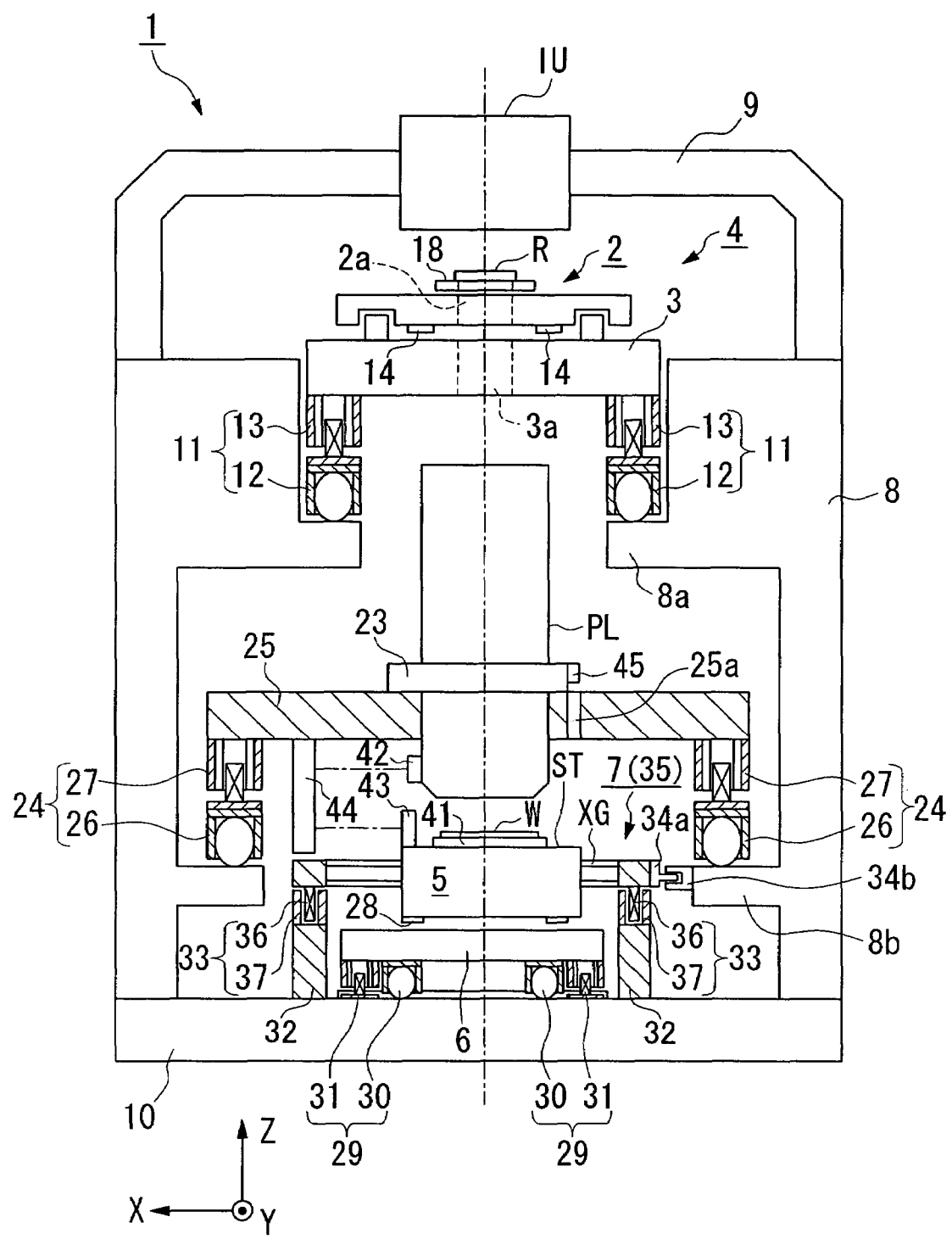
FIG. 1 is an overall schematic diagram illustrating one embodiment of an exposure apparatus having a holding apparatus of the present invention.
Figure 2:
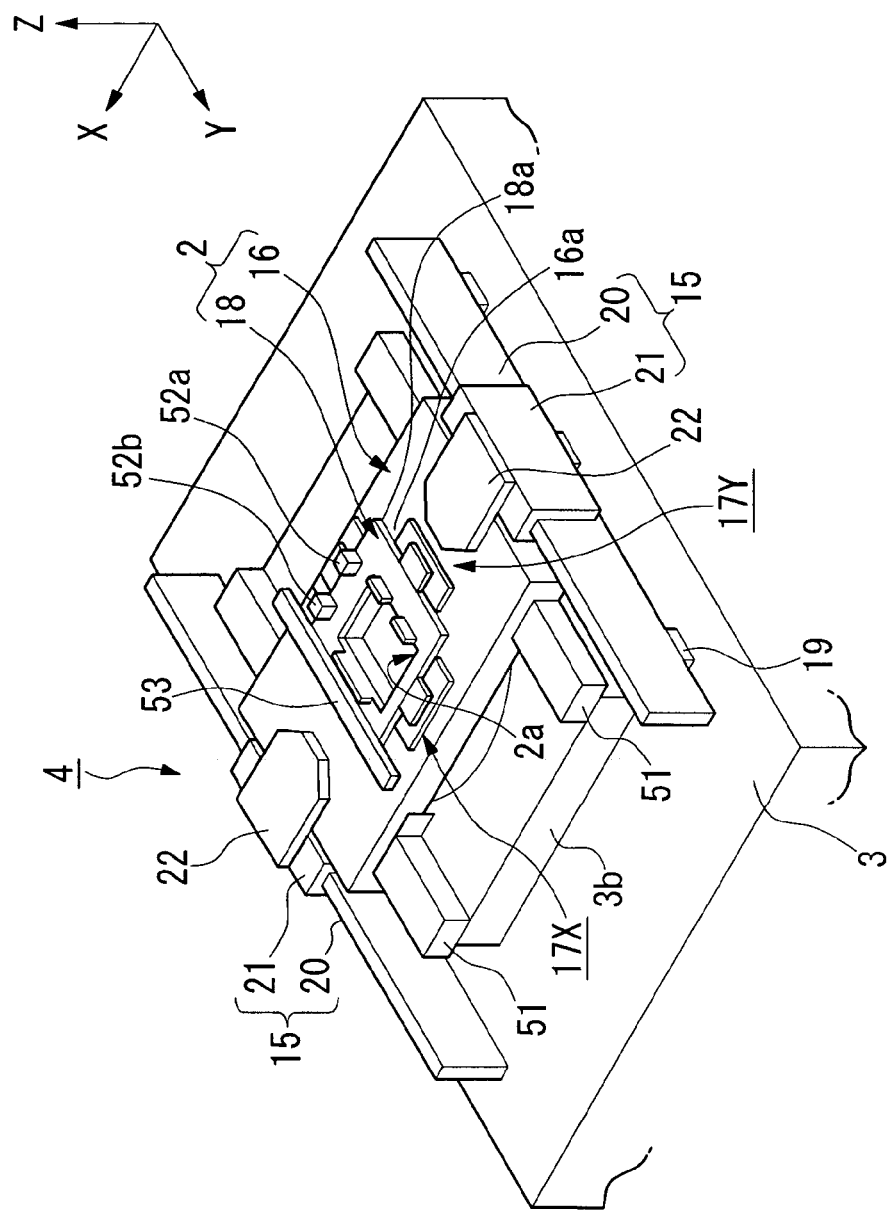
FIG. 2 is a perspective drawing of a stage apparatus having the holding apparatus constituting the exposure apparatus.
Figure 3:
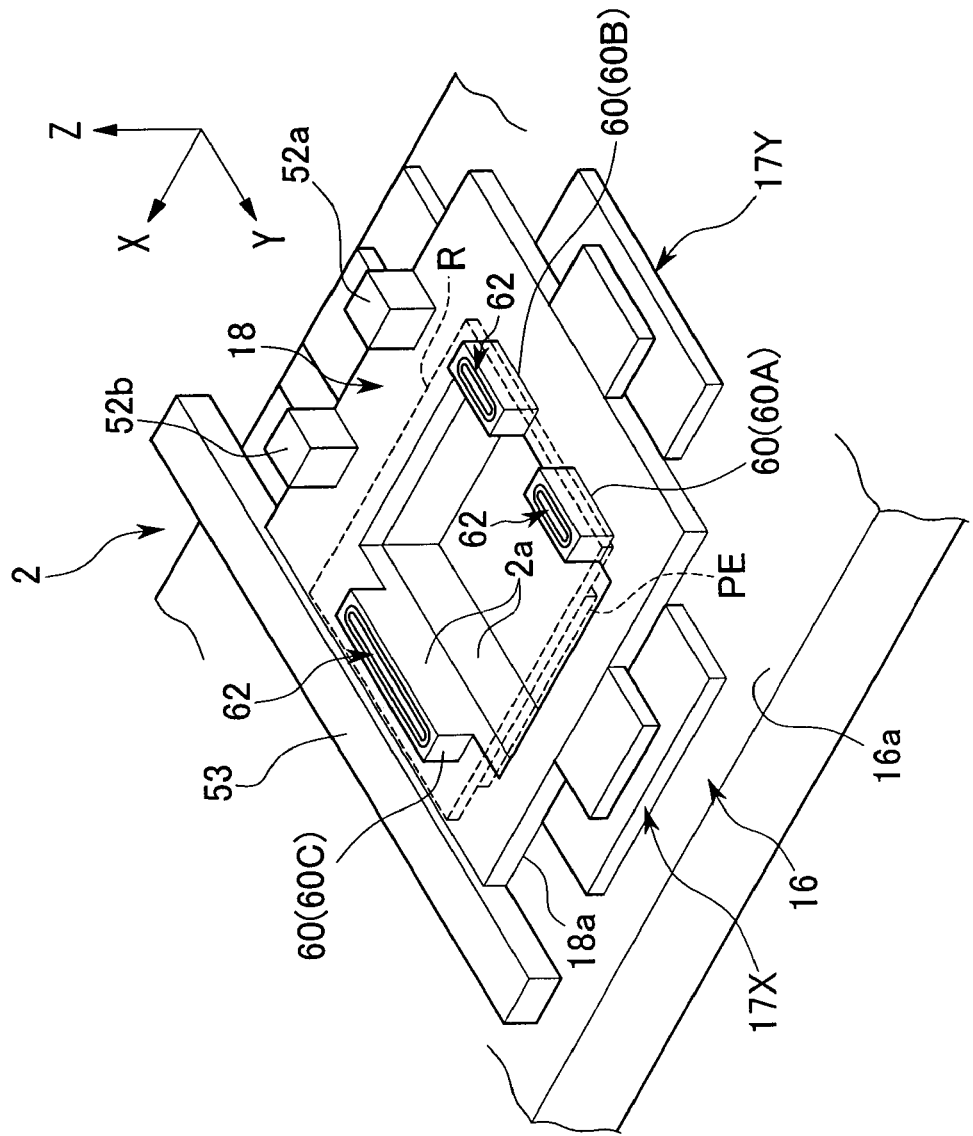
FIG. 3 is a perspective drawing of the holding apparatus of the present invention.
Figure 4:
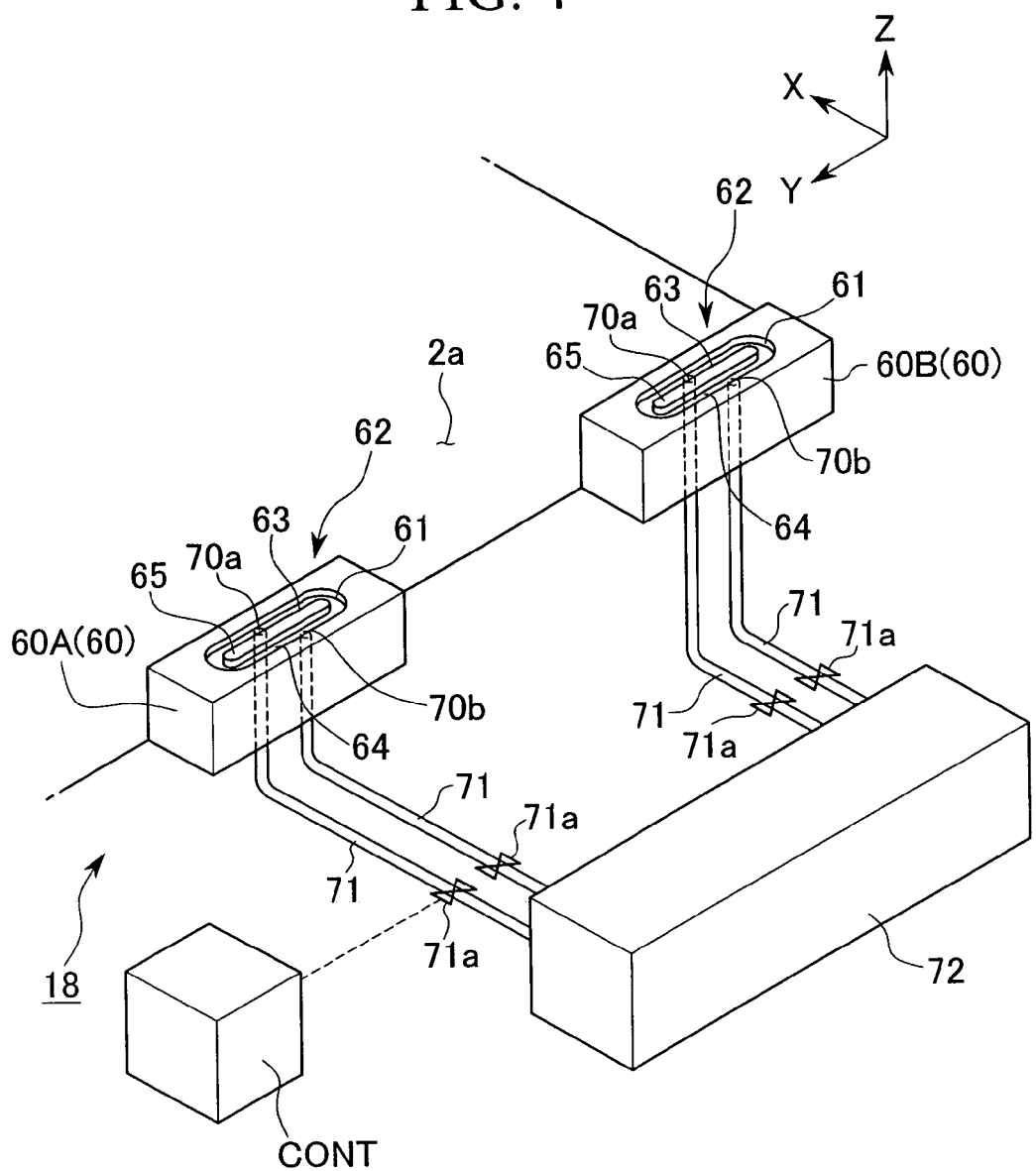
FIG. 4 is an enlarged perspective view of the main part in one embodiment of the holding apparatus of the present invention.
Figure 5A:
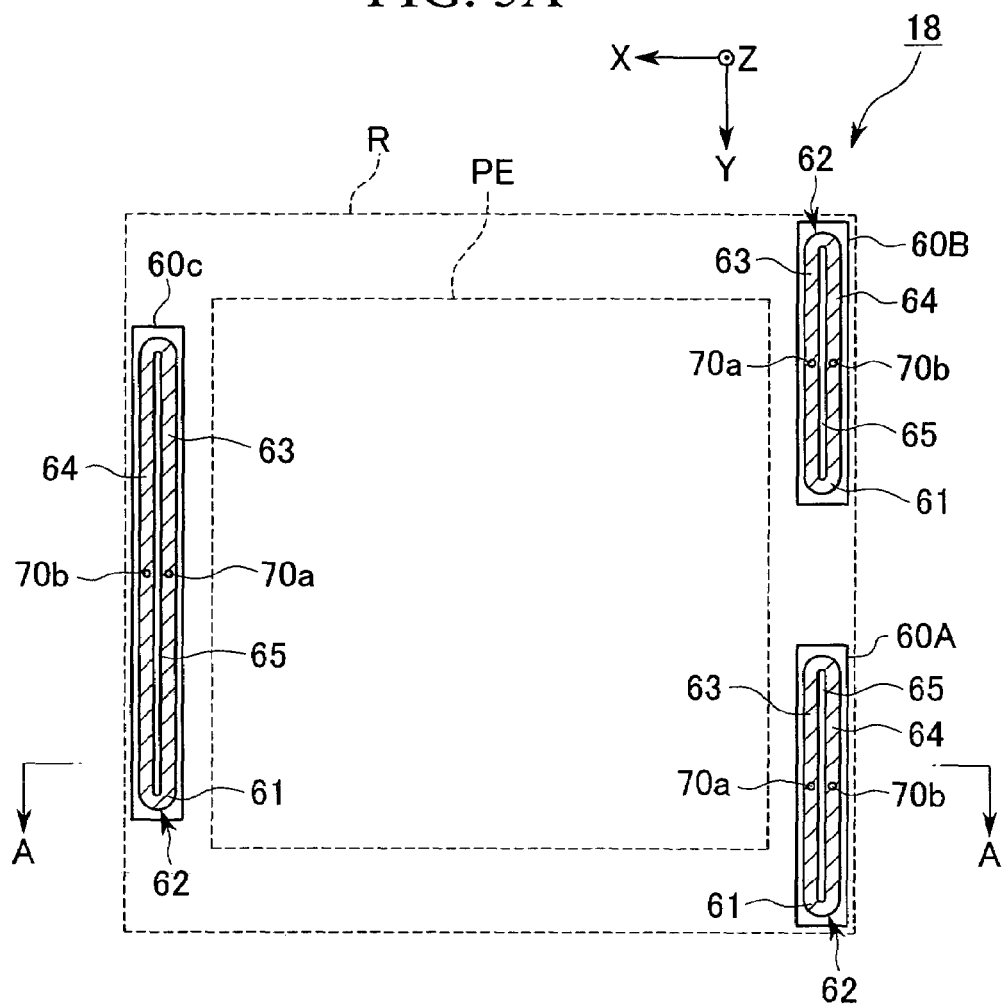
Figure 5B:
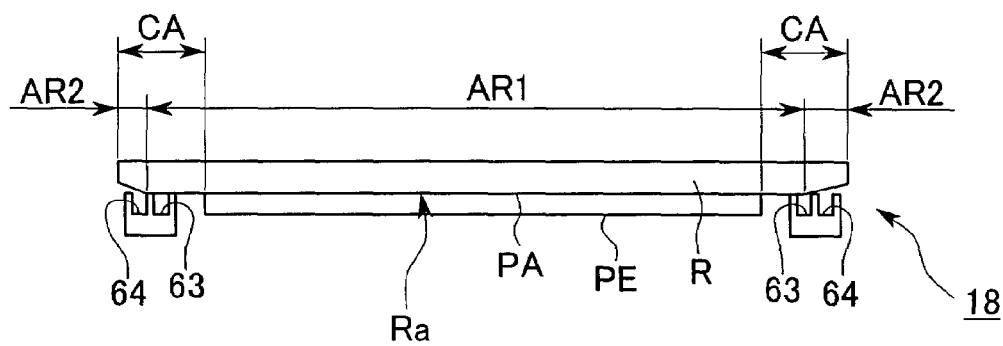
Figure 6:
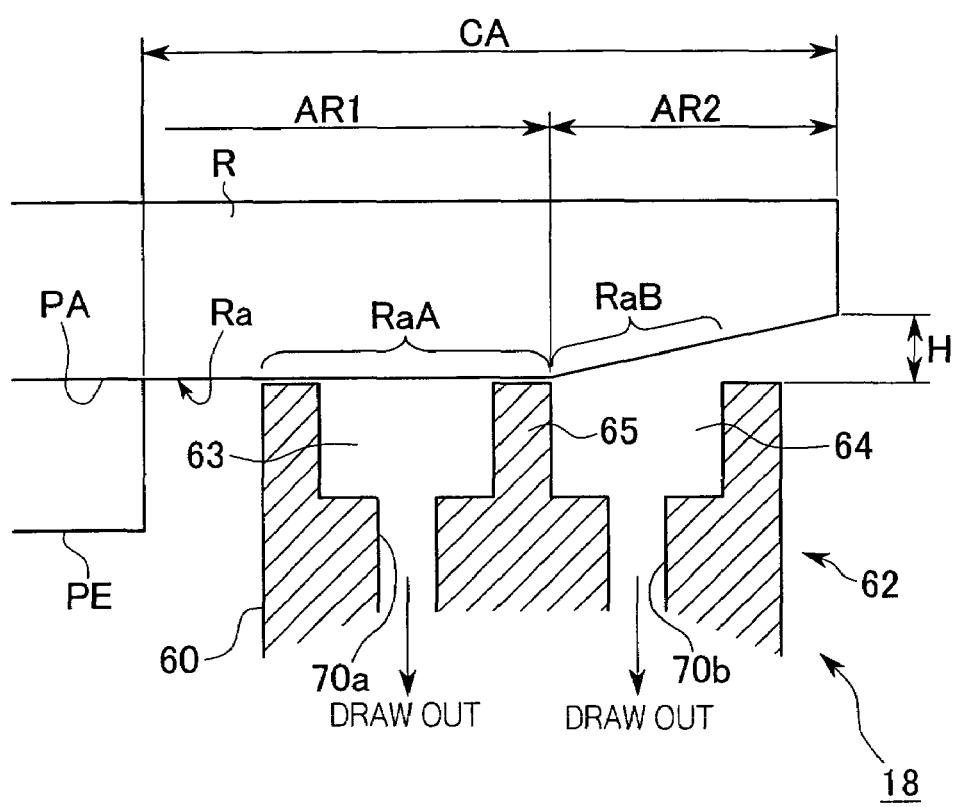
FIG. 6 is an enlarged sectional view of the main part, when the mask is held by the holding apparatus of the present invention.

At first, a first embodiment of the holding apparatus and the exposure apparatus of the present invention will be described, with reference to FIGS. 1 to 6. FIG. 1 is an overall schematic diagram of the exposure apparatus, and FIG. 2 is a perspective drawing of a reticle stage having a reticle holder (holding apparatus, mask holder) constituting the exposure apparatus. FIG. 3 is a perspective drawing of the reticle holder, and FIG. 4 is an enlarged view of the main part of the reticle holder. FIGS. 5A and 5B are schematic diagrams illustrating a state with a reticle held by the reticle holder, wherein FIG. 5A is a top view and FIG. 5B is a sectional view as seen in the direction of arrows A—A. FIG. 6 is an enlarged sectional view of the main part, when the reticle is held by the reticle holder.

The exposure apparatus 1 shown in FIG. 1 is schematically constituted by an illumination optical system IU which illuminates a rectangular (or circular-arc) illumination area on a reticle (sample, mask) R formed in a flat shape, with uniform illuminance by an exposure illumination light from a light source (not shown), a reticle holder 18 for holding the reticle R, a stage apparatus 4 including a movable reticle stage (mask stage) 2 including the reticle holder 18 and a reticle board 3 for supporting the reticle stage 2, a projection optical system PL which projects illumination light emitted from the reticle R onto a wafer (substrate, photosensitive substrate) W, a wafer holder (holding apparatus) 41 for holding the wafer W, a stage apparatus 7 including a movable wafer stage (substrate stage) 5 including the wafer holder 41 and a wafer board 6 for supporting the wafer stage 5, and a body 8 which supports the stage apparatus 4 and the projection optical system PL. Here, a direction of the optical axis of the projection optical system PL is referred to as the Z direction, a synchronous moving direction of the reticle R and the wafer W, being a direction orthogonal to the Z direction is referred to as the Y direction, and an asynchronous moving direction thereof is referred to as the X direction. A rotation direction about the respective axes is referred to as θZ, θY, and θx, respectively.

The illumination optical system IU is supported by a supporting column 9, which is fixed on the upper face of the body 8. As the exposure illumination light, there can be used, for example, the bright lines (a g line, an h line, and an i line) in the ultraviolet region emitted from a super-high pressure mercury lamp, far-ultraviolet light (DUV light) such as a KrF excimer laser beam (wavelength: 248 nm), and vacuum-ultraviolet light (VUV) such as an ArF excimer laser beam (wavelength: 193 nm) and an $F_2$ excimer laser beam (wavelength: 157 nm).

The body 8 is installed on a base plate 10 mounted horizontally on the floor, and steps 8a and 8b protruding inwards are respectively formed on the upper side and the lower side thereof.

Of the stage apparatus 4, the reticle board 3 is supported substantially horizontally on the steps 8a in the body 8 via vibration isolating units 11 at respective corners (the vibration isolating units 11 on the other side on the page are not shown), and an opening 3a through which a pattern image formed on the reticle R passes is formed at the center thereof. A metal or alumina ceramics can be used for the material of the reticle board 3. The vibration isolating units 11 respectively have a configuration such that an air mount 12 whose inner pressure is adjustable and a voice coil motor 13 are arranged on the step 8a in series. By these vibration isolating units 11, fine vibrations transmitted to the reticle board 3 via the base plate 10 and the body 8 are isolated at a micro G level (G is the acceleration of gravity).

The reticle stage 2 is supported on the reticle board 3 so as to be movable two-dimensionally along the reticle board 3. A plurality of air bearings (gas bearings) 14 is fixed on the bottom face of the reticle stage 2, and the reticle stage 2 is floated and supported on the reticle board 3 by these air bearings 14 via a clearance of several microns. An opening 2a through which a pattern image of the reticle R passes, is formed at the center of the reticle stage 2, so as to communicate with the opening 3a of the reticle board 3. The pattern image of the reticle R having passed through the openings 2a and 3a enters the projection optical system PL. As the projection optical system PL, there is used a dioptric system having a 1/4 (or 1/5) reduction magnification and comprising dioptric elements (lens elements) using quartz or fluorite as an optical glass, in which both the substance surface (reticle R) side and the image surface (wafer W) side have a telecentric and circular projection field of view. Therefore, when the illumination light is irradiated onto the reticle R, of the circuit pattern on the reticle R, an imaging beam from the portion illuminated by the illumination light enters the projection optical system PL, and a partial inverted image of the circuit pattern is imaged, restricted in a slit form at the center of the circular field of view on the image surface side of the projection optical system PL. As a result, the partial inverted image of the projected circuit pattern is transferred in a reduced scale onto a resist layer on the surface of one shot area, of a plurality of shot areas on the wafer W arranged on the imaging surface of the projection optical system PL.

A flange 23 integrally formed with a body tube is provided on the outer periphery of the body tube of the projection optical system PL. The projection optical system PL is inserted from above into the body tube board 25 formed of a casting, which is supported substantially horizontally via vibration isolating units 24 on the steps 8b in the body 8, setting the optical axis in the Z direction, with the flange 23 engaging with the body tube board 25. For the body tube board 25, ceramics material having high rigidity and low thermal expansion may be used.

For the material of the flange 23, a material having low thermal expansion, for example, Inver (an alloy having low expansion, comprising iron containing nickel 36%, manganese 0.25%, a small amount of carbon, and other elements) is used. The flange 23 constitutes a so-called kinematic support mount, which supports the projection optical system PL with respect to the body tube board 25 at three points via a point, a plane and a V groove. Use of such a kinematic support mount provides advantages in that assembly of the projection optical system PL with respect to the body tube board 25 becomes easy, and a stress due to vibrations of the body tube board 25 and the projection optical system PL after the assembly, and temperature changes can be reduced most effectively.

The vibration isolating units 24 are arranged at the respective corners of the body tube board 25 (the vibration isolating units 24 on the other side on the page are not shown), and respectively have a configuration such that an air mount 26 whose inner pressure is adjustable and a voice coil motor 27 are arranged on the step 8b in series. By these vibration isolating units 24, fine vibrations transmitted to the body tube board 25 (and the projection optical system PL) via the base plate 10 and the body 8 are isolated at a micro G level.

The stage apparatus 7 is composed mainly of the wafer stage 5, a wafer board 6 supporting the wafer stage 5 so as to be movable two-dimensionally along the XY plane, a sample support ST provided integrally with the wafer stage 5 for attracting and holding the wafer W, an X guide stage XG which supports the wafer stage 5 and the sample support ST relatively movably, and a synchronous stage apparatus which moves synchronously with the X guide stage XG. A plurality of air bearings (gas bearings) 28, being non-contact type bearings, is fixed on the bottom face of the wafer stage 5, and the wafer stage 5 is floated and supported on the wafer board 6 by these air bearings 28 via a clearance of several microns.

The wafer board 6 is supported substantially horizontally above the base plate 10 via vibration isolating units 29. The vibration isolating units 29 are arranged at the respective corners of the wafer board 6 (the vibration isolating units 29 on the other side on the page are not shown), and respectively have a configuration such that an air mount 30 whose inner pressure is adjustable and a voice coil motor 31 are arranged on the base plate 10 in parallel. By these vibration isolating units 29, fine vibrations transmitted to the wafer board 6 via the base plate 10 are isolated at a micro G level.

The X guide stage XG has a shape having a long length along the X direction, and movable elements 36 constituting an armature unit are respectively provided at the lengthwise opposite ends. Stators 37 having a magnet unit corresponding to the movable elements 36 are provided on support portions 32 protruding from the base plate 10. These movable elements 36 and stators 37 constitute moving-coil type linear motors 33. The X guide stage XG moves in the Y direction, by driving the movable elements 36 by the electromagnetic interaction with the stators 37, and also rotates and moves in the θZ direction by adjusting the drive of the linear motors 33. In other words, the linear motors 33 drive the wafer stage 5 (and the sample support ST, hereinafter simply referred to as the wafer stage 5) in the Y direction and the θZ direction, substantially integrally with the X guide stage XG.

A movable element 34a of an X trim motor 34 is attached to the −X direction side of the X guide stage XG. A stator 34b of the X trim motor 34 is provided on the body 8. Therefore, a reaction force at the time of driving the wafer stage 5 in the X direction is transmitted to the base plate 10 via the X trim motor 34 and the body 8.

The wafer stage 5 is supported and held in a non-contact manner by the X guide stage XG, so as to be able to move relatively in the X direction, via a magnetic guide comprising a magnet and an actuator, which maintains a predetermined gap in the Z direction between the X guide stage XG and the magnetic guide. The wafer stage 5 is driven in the X direction by the electromagnetic interaction due to the X linear motor 35 buried in the X guide stage XG. On the upper face of the wafer stage 5, the wafer W is fixed by vacuum attraction or the like via the wafer holder 41.

In the stage apparatus 7, a sample support detection device for detecting the position information of the sample support ST is arranged. The sample support detection device comprises an X movable mirror 43 provided at the side edge of the sample support ST so as to be extended along the Y direction, and a laser interferometer (interferometer) 44 arranged opposite to the X movable mirror 43. The laser interferometer 44 irradiates laser beams (detection beams) toward the reflecting surface of the X movable mirror 43 and a reference mirror 42 fixed at the bottom of the body tube of the projection optical system PL, and measures a relative displacement between the X movable mirror 43 and the reference mirror 42, based on the interference between the reflected light and the incident light, to thereby detect the position of the sample support ST (and the wafer W) in the X direction at a predetermined resolution, for example, at a resolution of from about 0.5 to 1 nm in real time. Similarly, though not shown in FIG. 1, there are also provided a Y movable mirror provided at the side edge of the sample support ST so as to be extended along the X direction, and a Y laser interferometer (interferometer) arranged opposite to the Y movable mirror with a gap in the X direction. The Y laser interferometer irradiates laser beams (detection beams) toward the reflecting surface of the Y movable mirror and a reference mirror (not shown) fixed at the bottom of the body tube of the projection optical system PL, and measures a relative displacement between the Y movable mirror and the reference mirror, based on the interference between the reflected light and the incident light, to thereby detect the position of the sample support ST (and the wafer W) in the Y direction and the position (rotation about the Z axis) thereof in the θZ direction (about the axis orthogonal to the relative movement direction) at a predetermined resolution, for example, at a resolution of from about 0.5 to 1 nm at a real time.

Three laser interferometers 45 are fixed at three different positions on the flange 23 of the projection optical system PL (however, only one laser interferometer is representatively shown in FIG. 1). An opening 25a is respectively formed in the portion of the body tube board 25, facing each laser interferometer 45, and laser beams (length measuring beams) in the Z direction are irradiated toward the wafer board 6 from the respective laser interferometers 45 via these openings 25a. Reflecting surfaces are respectively formed on the upper face of the wafer board 6, at positions facing each length measuring beam. Therefore, the Z position of the wafer board 6 at three different points is respectively measured based on the flange 23 by the three laser interferometers 45 (however, in FIG. 1, since a shot area at the center of the wafer W on the wafer stage 5 is in a state immediately below the optical axis of the projection optical system PL, the length measuring beam is interrupted by the wafer stage 5). Reflecting surfaces may be formed on the upper face of the sample support ST, and an interferometer for measuring the Z-direction positions of the three different points on the reflecting surfaces based on the projection optical system PL or the flange 23 may be provided.

The reticle stage 2 having the reticle holder 18 will now be described in detail, with reference to FIG. 2 to FIG. 6.

As shown in FIG. 2 to FIG. 4, the reticle stage 2 comprises a reticle coarse adjustment stage 16, and a reticle holder (holding apparatus) 18 as a reticle fine adjustment stage provided on the reticle coarse adjustment stage 16 (in FIG. 1, these are shown as one stage).

As shown in FIG. 2, a pair of Y linear motors (stage drive units) 15 are connected to the reticle coarse adjustment stage 16, so that the reticle coarse adjustment stage 16 is driven by these Y linear motors 15 on the reticle board 3, at a predetermined stroke in the Y-axis direction. The respective Y linear motors 15 respectively comprise a stator 20 supported so as to float on the reticle board 3 by a plurality of air bearings 19, being non-contact type bearings, and a movable element 21 provided corresponding to the stator 20 and fixed on the reticle coarse adjustment stage 16 via a connecting member 22. Therefore, in accordance with the law of conservation of momentum, the stator 20 moves in the −Y direction, corresponding to the movement of the reticle coarse adjustment stage 16 in the +Y direction. Due to the movement of the stator 20, a reaction force accompanying the movement of the reticle coarse adjustment stage 16 is compensated, and the position of the center of gravity can be prevented from changing.

The stators 20 may be provided on the body 8, rather than on the reticle board 3. When the stators 20 are provided on the body 8, the air bearings 19 are omitted, and the stators 20 are fixed on the body 8, so that the reaction force acting on the stators 20 due to the movement of the reticle coarse adjustment stage 16 may be removed to the floor via the body 8.

The reticle coarse adjustment stage 16 is guided in the Y-axis direction by a pair of Y guides 51 fixed on the upper face of an upper protrusion 3b formed at the center of the reticle board 3, and extending in the Y-axis direction. The reticle coarse adjustment stage 16 is supported in a non-contact manner by air bearings (gas bearings) (not shown) with respect to these Y guides 51. The reticle coarse adjustment stage 16 and the Y guides 51 are formed of, for example, a metal or alumina ceramics.

As shown in FIG. 2 and FIG. 3, a pair of X voice coil motors 17X and a pair of Y voice coil motors 17Y are provided on the reticle holder (reticle fine adjustment stage) 18. The reticle holder 18 is finely driven in the X, Y and θZ directions on the reticle coarse adjustment stage 16 by the voice coil motors, with the reticle holder 18 floated with respect to the upper face 16a of the reticle coarse adjustment stage 16 by the air bearings (not shown).

The reticle holder 18 is formed of ceramics, and particularly, formed of cordierite ceramics. Since this cordierite material has almost zero coefficient of thermal expansion, expansion of the reticle holder 18 due to the heat generated by the actuators (voice coil motors) and the like as the stage drive unit is suppressed. The reticle coarse adjustment stage 16 is also formed of ceramics, and cordierite or SiC ceramics may be used. The reticle coarse adjustment stage 16 may be formed of a metal such as stainless steel.

A pair of Y movable mirrors 52a and 52b consisting of corner cubes is provided at the −Y direction end of the reticle holder 18, and an X movable mirror 53 consisting of a plane mirror extending in the Y-axis direction is provided at the +X direction end of the reticle holder 18. Three laser interferometers (not shown) irradiate length measuring beams with respect to these movable mirrors 52a, 52b and 53 to measure a distance from the respective movable mirrors, to thereby measure the position of the reticle stage 2 in the X, Y and θZ (rotation about the Z axis) directions with high accuracy. The position information of the reticle stage 2 (the reticle holder 18 and the reticle coarse adjustment stage 16) measured by the laser interferometers is output to a control unit, and the control unit drives the stage drive unit (the linear motor 15, and the voice coil motors 17X and 17Y) so as to shift the reticle stage 2 to a predetermined position, based on the measurement result of the laser interferometers.

Similarly, the drive of the linear motors 33 and 35 for the wafer stage 5 is also controlled by a control unit (not shown) in an integrated manner.

As shown in FIG. 3, the reticle holder 18 comprises seat portions 60 (60A, 60B and 60C) respectively provided at a plurality of predetermined positions so as to protrude in the Z direction, and suction pads 62 respectively provided on the upper face of the seat portions 60. In this embodiment, three seat portions 60 and three suction pads 62 are provided. As described above, an opening 2a is provided, through which the pattern image of the reticle R can pass, at the center of the reticle holder 18. Similarly, an opening 2a is provided at the center of the reticle coarse adjustment stage 16.

As shown in FIG. 4 and FIG. 5, the respective suction pads 62 provided on the seat portions 60 comprise an annular groove 61 formed so as to extend in the Y direction, a boundary portion 65 formed inside of the annular groove 61, and a first pore (first suction device) 70a and a second pore (second suction device) 70b communicates with the annular groove 61. As shown in FIG. 4, the respective pores 70a and 70b are connected to a compressor (suction apparatus) 72 via suction paths 71. The pore 70a is arranged in a first suction section (first holding section) 63 of the annular groove 61, which is a linear portion on the opening 2a side, and the pore 70b is arranged in a second suction section (second holding section) 64 of the annular groove 61, which is a linear portion on the opposite side of the opening 2a (see the hashed portion in FIG. 5A, for the first suction section 63 and the second suction section 64). In other words, the respective first suction section 63 and second suction section 64 are arranged respectively in a plurality of positions (three places) with respect to the lower face Ra of the reticle R, and the first suction section 63 and the second suction section 64 are arranged adjacent to each other, with the boundary portion 65 placed therebetween.

Valves 71a capable of adjusting the suction quantity of a gas per unit time, which is sucked from the pores 70a and 70b, are respectively provided in the respective suction paths 71. The operation of the valves 71 a is separately controlled by a control unit CONT, respectively. In other words, the control unit CONT can control the suction quantity of the gas per unit time by the first pore 70a, and the suction quantity of the gas per unit time by the second pore 70b, respectively and separately. In FIG. 4, only the suction pads 62 provided on the seat portions 60A and 60B are shown, but the suction pad provided on the seat portion 60C has a similar configuration.

As shown in FIG. 3, FIG. 5B and FIG. 6, the reticle R has a pellicle PE for protecting a pattern area PA where a pattern is formed in the central part of the lower face (surface to be attracted) Ra. The seat portions 60 of the reticle holder 18 hold a holdable area CA, being portions other than the portion where the pellicle PE is provided, on the lower face of the reticle R. The reticle R has a precision warrantable area (first area) AR1 including the pattern area PA and having a predetermined surface precision, and a precision unwarrantable area AR2 other than the precision warrantable area AR1 of the lower face Ra. In other words, on the lower face Ra of the reticle R, the whole surface is not necessarily processed so as to have the predetermined surface precision, and the predetermined surface precision is not warranted on the outer rim portion.

As shown in FIG. 5B and FIG. 6, on the lower face Ra of the reticle R, the central part is a planar portion, and outsides of the central part are tapered portions formed in a direction away from the seat portion 60 outwards from the central side. The planar portion formed in the central part on the lower face of the reticle R becomes the precision warrantable area AR1, and the tapered portions are the precision unwarrantable area AR2. The tapered shape of the reticle R can be formed by grinding the outer rim on the lower face Ra of the reticle R by a grinding device. When the holdable area CA of the reticle R is mounted on the seat portions 60, the first suction section 63 in the suction pad 62 is set so as to be arranged opposite to the precision warrantable area AR1, of the lower face Ra of the reticle R. Moreover, the second suction section 64 in the suction pad 62 is set so as to be arranged opposite to the precision unwarrantable area AR2, of the lower face Ra of the reticle R. The suction apparatus 72 draws out the gas in the space between the precision warrantable area AR1 on the lower face Ra of the reticle R and the first suction section 63 via the pore (first suction device) 70a, and draws out the gas in the space between the precision unwarrantable area AR2 on the lower face Ra of the reticle R and the second suction section 64 via the pore (second suction device) 70b.

At this time, as shown in FIG. 6, the boundary portion 65 between the adjacent first suction section 63 and second suction section 64 is set to be arranged in the precision warrantable area AR1, on the lower face Ra of the reticle R.

It has been described above that the gas in the space between the precision warrantable area AR1 and the first suction section 63, and the gas in the space between the precision unwarrantable area AR2 and the second suction section 64 are drawn out via the pore 70a and the pore 70b, respectively and separately. However, in this embodiment, since the first suction section 63 and the second suction section 64 are connected to each other, the gas drawn out via the pore 70a includes a part of the gas in the space between the precision unwarrantable area AR2 and the second suction section 64, and the gas drawn out via the pore 70b includes a part of the gas in the space between the precision warrantable area AR1 and the first suction section 63.

As shown in FIG. 6, the upper end face of the first suction section 63 and the upper end face of the second suction section 64 are formed to be the same height. That is, the upper face of the suction pad 62 is flush.

The first suction section 63 and the planar precision warrantable area AR1 come in contact with each other, but there is a predetermined gap H between the second suction section 64 and the tapered precision unwarrantable area AR2. In other words, though the suction quantity of the gas per unit time from the first pore 70a and the suction quantity of the gas per unit time from the second pore 70b are set to be the same value, by providing the gap H, the area on the lower face Ra of the reticle R to be attracted by the first suction section 63 becomes larger than the area attracted by the second suction section 64. In other words, if it is assumed that the length thereof in the direction perpendicular to the page in FIG. 6 is the same, RaA becomes larger than RaB. As a result, the attraction of the second suction section 64 with respect to the reticle R becomes weaker than that of the first suction section 63 with respect to the reticle R. This gap H is set such that the reticle R is not distorted due to the precision unwarrantable area AR2 being attracted by the second suction section 64, and such that the second suction section 64 and the first suction section 63 can stably hold the reticle R.

A method for holding the reticle R by the reticle holder 18 having the above described configuration will now be described.

A predetermined reticle R is loaded on the reticle holder 18 by a reticle carrier device (not shown). When the reticle R is loaded with respect to the reticle holder 18, loading is performed while performing alignment such that of the holdable area CA of the reticle R, the precision warrantable area AR1 faces the first suction section 63 and the precision unwarrantable area AR2 faces the second suction section 64. At this time, alignment is performed such that of the suction pad 62, the boundary portion 65 between the first suction section 63 and the second suction section 64 is arranged at least in the precision warrantable area AR1.

When the reticle R has been loaded on the reticle holder 18, the control unit CONT drives the suction apparatus 72, and controls the valves 71a respectively provided in the suction path 71, to set the suction quantity of the gas per unit time by the first pore 70a and the suction quantity of the gas per unit time by the second pore 70b to a set value set beforehand. In this embodiment, the control unit CONT sets the suction quantity of the gas per unit time by the first pore 70a and the suction quantity of the gas per unit time by the second pore 70b to the same value.

The reticle R is attracted and held such that the precision warrantable area AR1 and the precision unwarrantable area AR2 are respectively attracted by the first suction section 63 and the second suction section 64. Since a wide range of the holdable area CA of the reticle R is held by using the first suction section 63 and the second suction section 64, the reticle R is stably held by the reticle holder 18, and even if the reticle stage 2 moves at high speed, the reticle R is not shifted from the reticle holder 18 due to inertia force.

Moreover, since the precision warrantable area AR1 of the reticle R is held by the first suction section 63, and the precision unwarrantable area AR2 is held by the second suction section 64, separately, the reticle holder 18 can hold the reticle R stably without deforming the reticle R. In other words, since the precision unwarrantable area AR2 of the reticle R is formed in a tapered shape, to provide a gap H between the second suction section 64 and the precision unwarrantable area AR2, the area on the lower face Ra of the reticle R attracted by the first suction section 63 becomes larger than the area attracted by the second suction section 64, and hence attraction of the second suction section 64 with respect to the reticle R is set to be weaker than that of the first suction section 63 with respect to the reticle R. Therefore, at the time of attracting and holding the precision unwarrantable area AR2, distortion of the whole reticle R resulting from the precision unwarrantable area AR2 being attracted and held can be suppressed.

At this time, the leak quantity from the gap H (that is, the gap H) is set such that the reticle R is not distorted, and the stable holding power with respect to the reticle R does not drop. In other words, the leak quantity from the gap H is set such that even if the reticle stage 2 moves at high speed, the reticle R is not shifted from the reticle holder 18 due to the inertia force. The pattern formed on the reticle R can be exposed on the wafer W with high accuracy via the projection optical system PL, by irradiating the exposure light from the illumination optical system IU onto the reticle R held by the reticle holder 18.

The reason why the reticle holder 18 can hold the reticle R without any deformation by holding the precision warrantable area AR1 of the reticle R by the first suction section 63 and holding the precision unwarrantable area AR2 by the second suction section 64 will be described below, with reference to FIGS. 7A to 7D, FIG. 8 and FIG. 9.

FIGS. 7A to 7D are schematic diagrams in which simulation results of the shape (deformation) of the reticle R are shown, when the tapered area of the reticle R, that is, the size L of the precision unwarrantable area AR2 of the reticle R is set to different values, and the reticle R is attracted and held by the first suction section 63 and the second suction section 64, respectively. FIGS. 7A to 7D are diagrams when the size L of the precision unwarrantable area is set to 5.5 mm, 7.5 mm, 9.0 mm, and 10.5 mm, respectively. In the respective figures of FIGS. 7A to 7D, the maximum value H of the gap between the second suction section 63 and the precision unwarrantable area AR2 is set to the same value (0.5 µm), and the same reticle holder 18 (suction pad 62) is used.

Figure 7A:
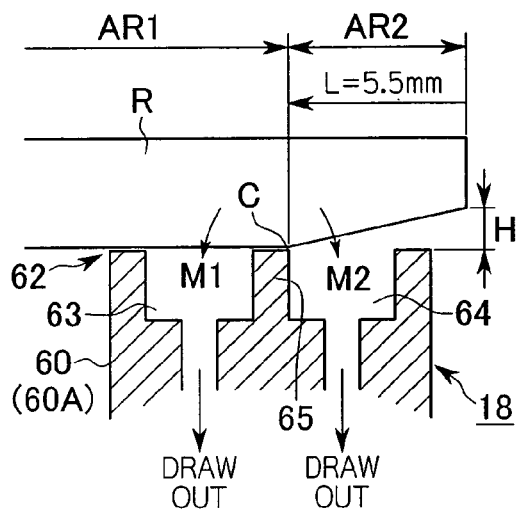
FIG. 7A to FIG. 7D are diagrams for explaining a relation between the shape of a mask held by the holding apparatus and deformation thereof.

FIG. 7A illustrates the simulation result, when the size L of the precision unwarrantable area AR2 is set to 5.5 mm. In this figure, the precision warrantable area AR1 is held by the first suction section 63, and the precision unwarrantable area AR2 is held by the second suction section 64. At this time, the boundary portion 65 between the first suction section 63 and the second suction section 64 is arranged in the precision warrantable area AR1.

In this state, when the reticle R is attracted by the first suction section 63 and the second suction section 64, as shown in FIG. 7A, moments M1 and M2 about a point C are generated. This point C is a point on the precision warrantable area AR1. As described above, at this time, the attraction by the second suction section 64 with respect to the precision unwarrantable area AR2 becomes weaker than that by the first suction section 63 with respect to the precision warrantable area AR1 due to the gap H, and the area of the first suction section 63 with respect to the precision warrantable area AR1 is larger than the area of second suction section 64 with respect to the precision unwarrantable area AR2. As a result, M1 is larger than M2, and hence a force that allows the precision warrantable area AR1 to peel off from the first suction section 63 is not generated with respect to the reticle R. Therefore, in this state, the reticle R is held by the reticle holder 18 stably.

Figure 7B:
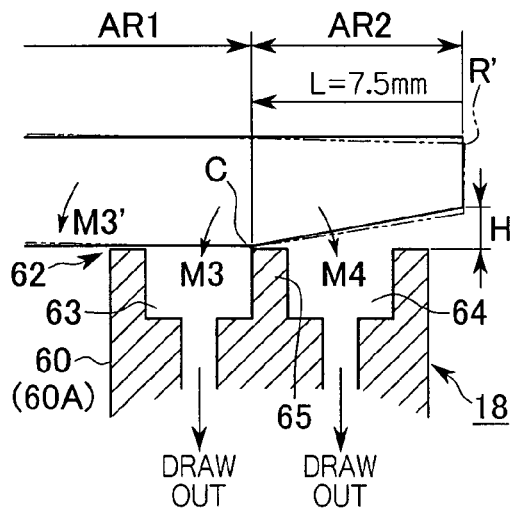

FIG. 7B illustrates the simulation result, when the size L of the precision unwarrantable area AR2 is set to 7.5 mm. In this figure, the precision warrantable area AR1 is held by the first suction section 63, and the precision unwarrantable area AR2 is held by the second suction section 64. At this time, the boundary portion 65 between the first suction section 63 and the second suction section 64 is arranged in the precision unwarrantable area AR2.

In this state, when the reticle R is attracted by the first suction section 63 and the second suction section 64, as shown in FIG. 7B, moments M3 and M4 about the point C are generated. In this case, the area of the first suction section 63 with respect to the precision warrantable area AR1 is smaller than the area of second suction section 64 with respect to the precision unwarrantable area AR2, and the attraction by the second suction section 64 with respect to the precision unwarrantable area AR2 becomes stronger than that by the first suction section 63 with respect to the precision warrantable area AR1. As a result, M4 is larger than M3. Then, a force that allows the precision warrantable area AR1 to peel off from the first suction section 63 acts on the reticle R, and as shown by the broken line R', the reticle R deforms so as to raise the central portion (pattern area). Therefore, since the precision warrantable area AR1 including the pattern area also distorts, it is not desired to set the area of the first suction section 63 with respect to the precision warrantable area AR1 to be smaller than the area of second suction section 64 with respect to the precision unwarrantable area AR2.

In this case, if it is assumed that the seat portion in FIG. 7B is 60A (or 60B), attraction operation with respect to the reticle R is conducted by the first suction section 63 and the second suction section 64 in the seat portion 60C on the opposite side. Therefore, a reaction force M3' against bending acts on the reticle R, as shown in FIG. 7B. Moreover, since the center C of the moment exists on the boundary portion 65, moments about the point C are balanced, so that the first suction section 63 and the precision warrantable area AR1 do not peel off from each other.

Figure 7C:
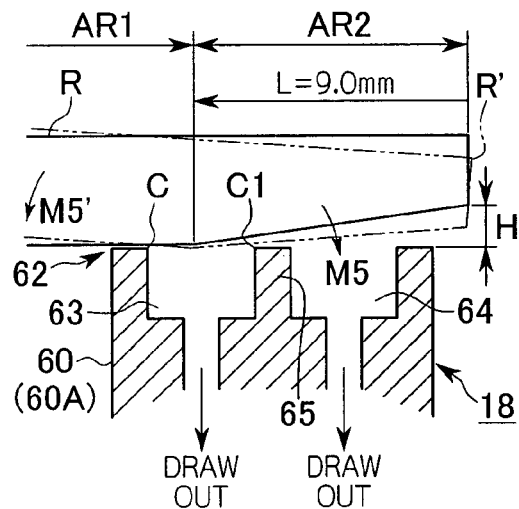

FIG. 7C illustrates the simulation result, when the size L of the precision unwarrantable area AR2 is set to 9.0 mm. In this figure, the precision warrantable area AR1 and a part of the precision unwarrantable area AR2 are held by the first suction section 63, and the precision unwarrantable area AR2 is held by the second suction section 64. At this time, the boundary portion 65 between the first suction section 63 and the second suction section 64 is arranged completely in the precision unwarrantable area AR2.

In this state, when the reticle R is attracted by the first suction section 63 and the second suction section 64, as shown in FIG. 7C, a moment M5 about the point C is generated. In this case, the area of the first suction section 63 with respect to the precision warrantable area AR1 is smaller than the area of second suction section 64 with respect to the precision unwarrantable area AR2. In this case, the reticle R deforms so as to raise the central portion (pattern area), as shown by the broken line R', and the first suction section 63 and the precision warrantable area AR1 peel off from each other completely.

If it is assumed that the seat portion in FIG. 7C is 60A (or 60B), a reaction force M5' against bending acts on the reticle R, as shown in FIG. 7C, due to the attraction operation with respect to the reticle R by the first suction section 63 and the second suction section 64 in the seat portion 60C on the opposite side. The deformation of the reticle R finishes at a point in time when the deformation of the reticle R progresses so that a point C1 of the reticle R comes in contact with the boundary portion 65, and the moment about this point C1 is balanced with the reaction force M5'.

Figure 7D:
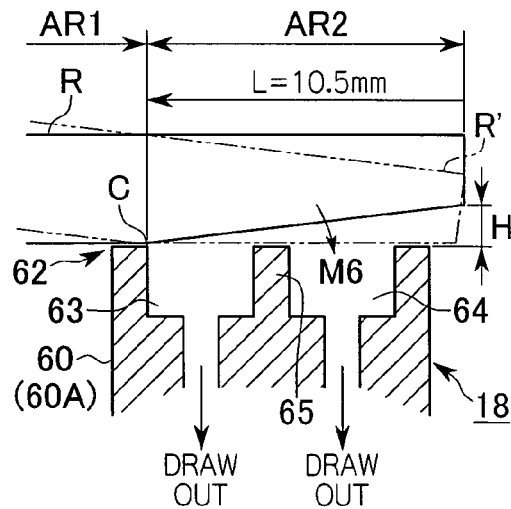

FIG. 7D illustrates the simulation result, when the size L of the precision unwarrantable area AR2 is set to 10.5 mm. In this figure, the precision warrantable area AR1 is neither held by the first suction section 63 nor the second suction section 64, and the precision unwarrantable area AR2 is held by the first suction section 63 and the second suction section 64. The boundary portion 65 between the first suction section 63 and the second suction section 64 is arranged in the precision unwarrantable area AR2.

In this state, when the reticle R is attracted by the first suction section 63 and the second suction section 64, as shown in FIG. 7D, a moment M6 about the point C is generated. In this case, the area of the first suction section 63 with respect to the precision warrantable area AR1 is almost zero. The reticle R deforms so as to raise the central portion (pattern area), as shown by the broken line R', and the first suction section 63 and the precision warrantable area AR1 peel off from each other completely.

The deformation of the reticle R finishes at a point in time when the precision unwarrantable area AR2 comes in contact with the first suction section 63 and the second suction section 64, as shown by the broken line R'.

As described above, as in the state shown by FIG. 7A, by setting the size L to not larger than 5.5 mm, so that the boundary portion 65 between the first suction section 63 and the second suction section 64 is arranged in the precision warrantable area AR1, and the area of the first suction section 63 with respect to the precision warrantable area AR1 is larger than the area of second suction section 64 with respect to the precision unwarrantable area AR2, occurrence of peeling between the first suction section 63 and the precision warrantable area AR1 can be suppressed, and distortion of the reticle R can be prevented.

Figure 9:
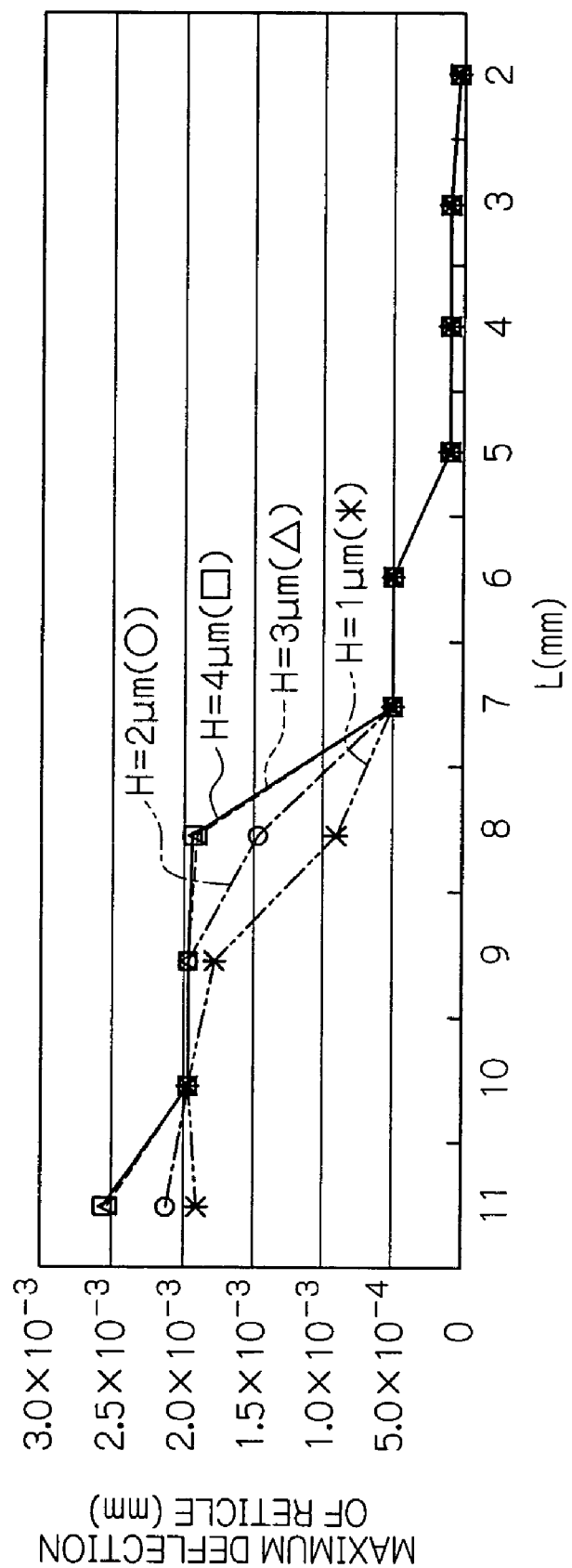
FIG. 9 is a graph obtained by changing the table in FIG. 8 to a graphical representation.

FIG. 8 shows simulation results at the time of obtaining the maximum deflection of the reticle R, when the size L of the precision unwarrantable area AR2 and the maximum gap H between the second suction section 64 and the precision unwarrantable area AR2 are respectively changed. FIG. 9 is obtained by changing the table in FIG. 8 to a graphical representation, wherein the maximum deflection of the reticle R is plotted on the Y axis, and the size L of the precision unwarrantable area AR2 is plotted on the X axis. Here, the maximum deflection of the reticle R stands for a distance in the Z direction between the end portion and the central portion of the reticle R, when the reticle R deforms to raise the central portion.

From these figures, it is seen that the maximum deflection of the reticle R increases rapidly, when the size L is 2.5 mm, 5.5 mm and 7.5 mm. From this result, it has been found that the deformation of the reticle R largely depends on the size L of the precision unwarrantable area AR2, that is, whether the precision unwarrantable area AR2 is attracted by the first suction section 63.

Next is a description of another embodiment of the holding apparatus of the present invention. In the following description with reference to the drawings, components the same as or equivalent to those in the above described embodiment are denoted by the same reference symbols, and the description thereof is simplified or omitted.

Figure 10:
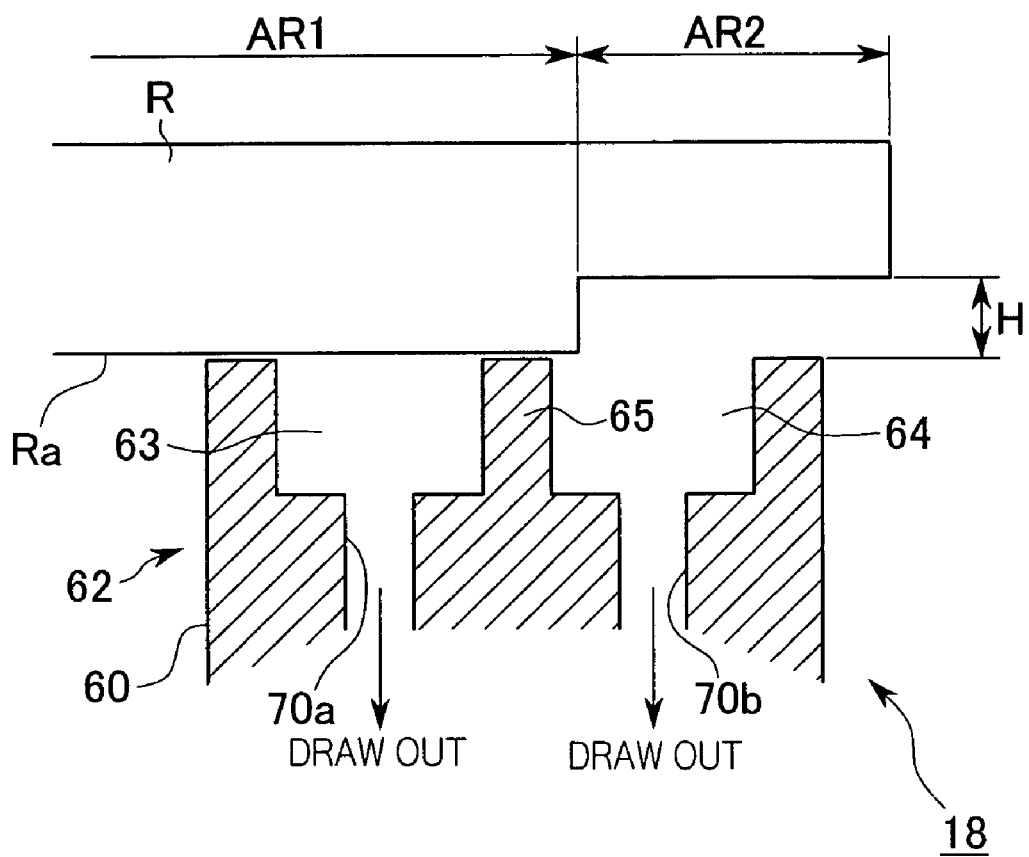
FIG. 10 is a sectional view indicating another example of the mask of the present invention.

The shape of the precision unwarrantable area AR2 of the reticle R is not limited to the tapered shape, provided this is set corresponding to the shape of the second suction section 64 which attracts and holds the precision unwarrantable area AR2 of the reticle R, so as to have a predetermined gap H between the second suction section 64 and the precision unwarrantable area AR2 of the reticle R. For example, as shown in FIG. 10, the precision unwarrantable area AR2 may be a step formed in a direction away from the second suction section 64.

Figure 11:
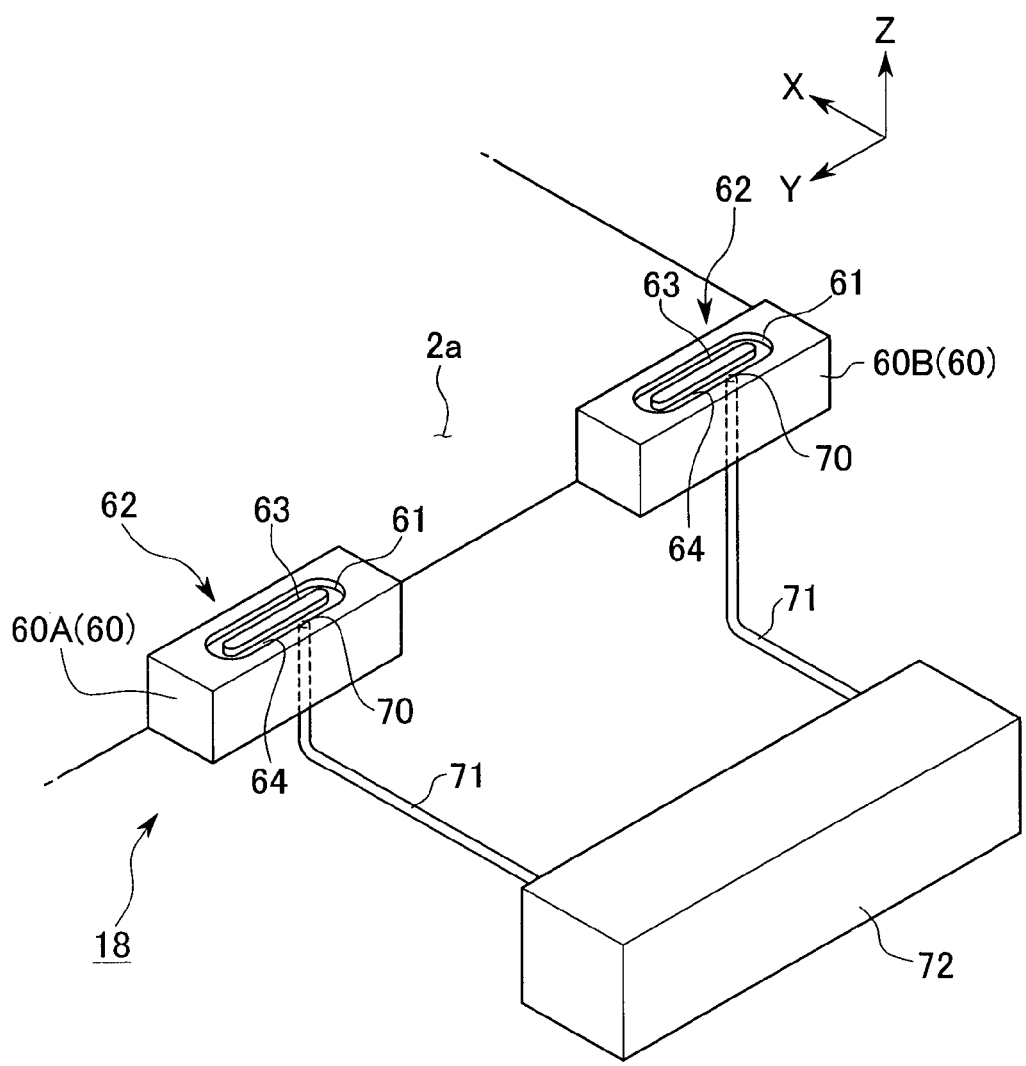

In this embodiment, the construction is such that the pores connected to the suction apparatus 72 via the suction path 71 are respectively provided in the first suction section 63 and the second suction section 64, being linear portions of the annular groove 61 formed in the suction pad 62 so as to extend in the Y direction. However, as shown in FIG. 11, the pore provided in the annular groove 63 may be only one. In this case, since the first suction section 63 and the second suction section 64 are a part of the annular groove 61, and are continuous, then even if the pore 70 is only one, the suction operation can be stably performed. Moreover, the pores 70 may be provided at a plurality of optional positions, respectively, in the annular groove 61. In this case, the suction path 71 is connected to each of the plurality of pores, to perform the suction operation by the suction apparatus 72.

In this embodiment, the suction quantity of the gas per unit time from the first pore 70a and the suction quantity of the gas per unit time from the second pore 70b are set to be the same value, but the respective suction quantity may be set to different values. In this case, as shown in FIG. 4, the control unit CONT controls the valves 71a respectively provided in a plurality of connecting paths 71, respectively and separately. Alternatively, other than the control by the valves 71a, the suction apparatus 72 may be provided respectively separately with respect to each of the suction paths 71, so that the control unit CONT controls the respective outputs of the suction apparatus 72 separately.

In this embodiment, by providing the gap H between the second suction section 64 and the precision unwarrantable area AR2, the attraction by the second suction section 64 with respect to the precision unwarrantable area AR2 is set to be weaker than that by the first suction section 63 with respect to the precision warrantable area AR1. However, the attraction by the second suction section 64 with respect to the precision unwarrantable area AR2 may be set to become weaker than that by the first suction section 63 with respect to the precision warrantable area AR1, by setting such that the suction quantity of the gas per unit time from the first pore 70a is larger than the suction quantity of the gas per unit time from the second pore 70b.

Figure 12:
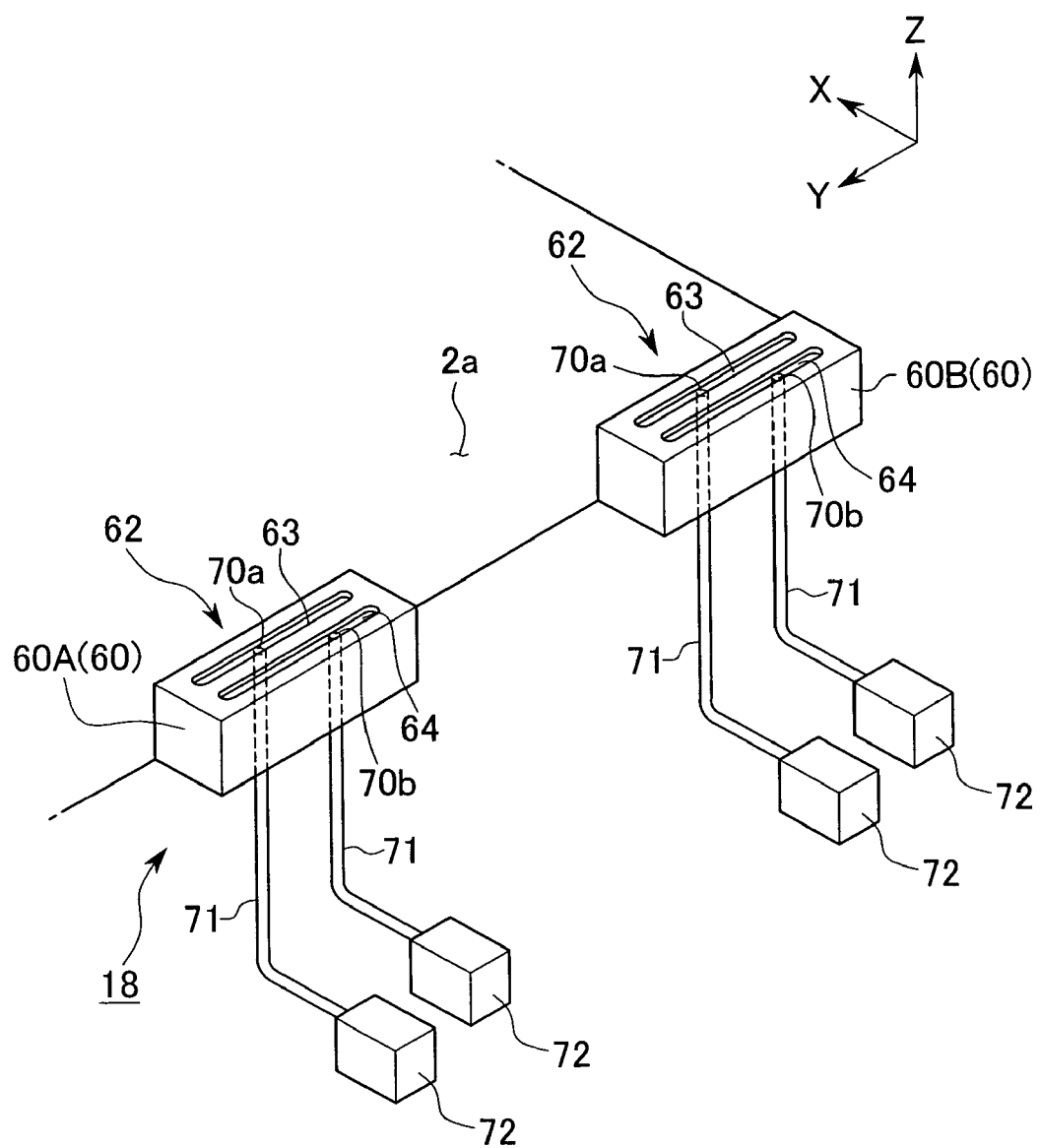

In this embodiment, the respective linear portions of the annular groove 61 formed in the suction pad 62 so as to extend in the Y direction, are designated as the first suction section 63 and the second suction section 64. However, as shown in FIG. 12, the first suction section 63 and the second suction section 64 may be provided in the suction pad 62, respectively and separately. Then, the pore 70 is respectively provided for the first suction section 63 and the second suction section 64, and by connecting the first suction section 63 and the second suction section 64 separately to the suction apparatus 72, the suction operation by the first suction section 63 and the second suction section 64 becomes possible. In this case, by separately controlling the outputs of the respective suction apparatus 72, the attraction by the first suction section 63 with respect to the precision warrantable area AR1 and the attraction by the second suction section 64 with respect to the precision unwarrantable area AR2 can be controlled respectively and separately.

In this embodiment, the height position of the first suction section 63 and that of the second suction section 64 are set to be the same, but as shown in FIG. 13A. the height position thereof may be set such that the second suction section 64 is at a lower position with respect to the lower face Ra of the reticle R than the first suction section 63. By having such a construction, a predetermined gap H can be formed between the second suction section 64 and the precision unwarrantable area AR2 of the reticle R, even if the tapered portion is not formed in the reticle R.

On the other hand, as shown in FIG. 13B, the height position of the second suction section 64 may be set at a higher position with respect to the lower face Ra of the reticle R than the first suction section 63. By having such a construction, a predetermined gap H can still be formed between the second suction section 64 and the precision unwarrantable area AR2 of the reticle R, even if the precision unwarrantable area AR2 of the reticle R is formed in a direction to largely separate this from the suction pad 62.

In other words, the height position of the second suction section 64 is set according to the shape of the lower face Ra of the reticle R.

Moreover, a seat portion where the first suction section 63 is provided, and a seat portion where the second suction section 64 is provided may be provided independently, and either one of the two seat portions may be supported by a supporting apparatus movable in the Z direction so that the seat portion which is supported movably is moved in the Z direction to thereby control the height position of the first suction section 63 or the second suction section 64. At this time, the respective seat portions may be arranged side by side in the X direction, or may be arranged away from each other in the Y direction.

Furthermore, the respective seat portions 60A, 60B and 60C shown in FIG. 3 may be supported by a supporting apparatus movable in a direction approaching or separating from the opening 2a (that is, in the X direction), and the seat portions may be moved so that the second suction sections 64 provided in the respective seat portions hold the precision unwarrantable area AR2, corresponding to the size L of the precision unwarrantable area AR2 of the reticle R to be mounted.

Figure 14:
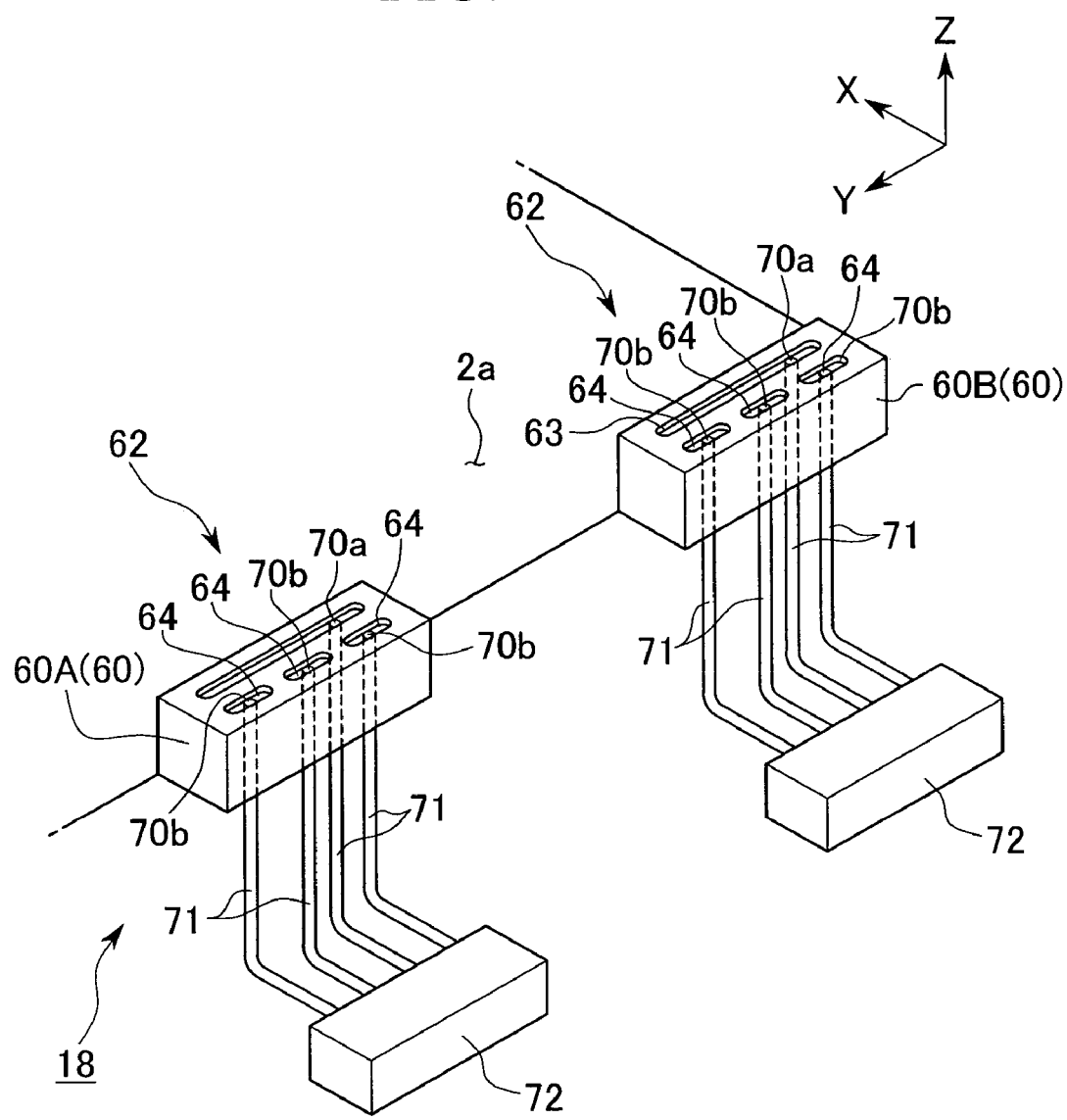

It is not necessary to make the sizes of the first suction section 63 and the second suction section 64 the same, and these may have a different size (area). For example, the width (the size in the X direction) of the second suction section 64 may be set to be smaller than the width (the size in the X direction) of the first suction section 63. Alternatively, as shown in FIG. 14, the sizes in the Y direction of the first suction section 63 and the second suction section 64 may be set to be different from each other. The respective suction pads 62 shown in FIG. 14 comprise one first holding section 63, and three second holding sections 64 smaller than the first holding section 63. In this case, the total of the respective sizes (areas) of the three second holding sections 64 is set to be smaller than the size (area) of the first holding section 63. The upper face of a seat portion 60 which does not have the suction function is exposed between the second holding portions 64. By having such a construction, the attraction of the second suction section 64 with respect to the precision unwarrantable area AR2 can be set to be smaller than that of the first suction section 63 with respect to the precision warrantable area AR1, and hence the reticle holder 18 can stably hold the reticle R without any distortion.

In this embodiment, three seat portions having the suction pad 62 are provided, but the seat portion having the suction pad 62 may be provided in a plurality of optional positions. Moreover, in this embodiment, each of the suction pads 62 has the first suction section 63 and the second suction section 64, but the construction may be such that, of the suction pads 62 provided in the plurality of seat portions, only the first suction section 63 is provided and the second suction section 64 is not provided in some suction pads.

When a plurality of seat portions 60 having the suction pad 62 is provided, it is not necessary to perform the attraction operation with respect to the reticle R by all the suction pads 62. For example, of the suction pads 62 provided in a plurality of places, some of the optional suction pads 62 may be used to perform the attraction operation with respect to the reticle R, and the other suction pads 62 need not perform the attraction operation. In other words, the construction may be such that the attraction operation by the suction pads 62 provided in a plurality of places can be switched.

The suction quantity of the gas per unit time from the second pore 70b provided in the second suction section 64 (that is, the attraction of the second suction section 64 with respect to the precision unwarrantable area AR2), or the suction position of the second suction section 64 with respect to the reticle R may be set corresponding to the shape (degree of deformation) of the reticle R. In other words, the suction quantity of the gas per unit time from the second pore 70b is controlled, or when the second suction section 64 is movably provided, the position thereof is controlled, so that the reticle R held by the reticle holder 18 becomes flat, in order to perform the exposure processing with high accuracy.

Setting of the suction quantity of the gas per unit time from the second pore 70b, and setting of the position of the second suction section 64 may be performed, for example, by measuring the shape (deformation quantity) of the reticle R by a shape measuring device (an optical shape sensor or the like), so that the shape of the reticle R becomes a desired shape based on the measurement result.

In this embodiment, the tapered portion of the reticle R is designated as the precision unwarrantable area AR2, but a part of the tapered portion may include the precision warrantable area.

When the attraction holding power with respect to reticle R by the reticle holder 18 is not sufficient, the holding power can be improved by pressing downward from above a portion on the upper face of the reticle R corresponding to the position held by the reticle holder 18, for example, by a predetermined pressing apparatus.

In this embodiment, a gap H is provided between the second holding section 64 and the precision unwarrantable area AR2 of the reticle R, but since this gap H is for example about 5 μm, the second holding section 64 can perform the attraction operation with respect to the reticle R due to the viscosity of the gas (air).

In this embodiment, the holding apparatus of the present invention is applied to the reticle holder, but it is also applicable to the wafer holder 41 for holding the wafer W.

The holding apparatus of the present invention is also applicable to apparatus other than the exposure apparatus, for example, survey instruments or apparatus for forming a circuit pattern on a reticle.

The substrate in this embodiment is applicable not only to the semiconductor wafer W for semiconductor devices, but also to a glass substrate for liquid crystal display devices and a ceramic wafer for thin film magnetic heads.

The exposure apparatus 1 is also applicable to a projection exposure apparatus of a step and repeat type (stepper) wherein a pattern of the reticle R is exposed in a state with the reticle R and the wafer W stationary, and the wafer W is sequentially shifted step by step, in addition to a scanning exposure apparatus of a step and scan type (scanning stepper; U.S. Pat. No. 5,473,410) wherein a pattern of the reticle R is scanned and exposed, while the reticle R and the wafer are synchronously moved.

The kinds of the exposure apparatus 1 are not limited to the exposure apparatus for manufacturing semiconductor devices wherein a semiconductor device pattern is exposed on the wafer W, and for example, the exposure apparatus is widely applicable to exposure apparatus for manufacturing liquid crystal display elements, or exposure apparatus for manufacturing thin film magnetic heads, image-sensing devices (CCD) or reticles.

For the light source for the exposure illumination light, not only bright lines (a g line (436 nm), an h line (404.7 nm), and an i line (365 nm)) emitted from a super-high pressure mercury lamp, a KrF excimer laser (248 nm), an ArF excimer laser (193 nm) and an $F_2$ excimer laser (157 nm), but also an X-ray or charged particle beams such as electron beams may be used. For example, when the electron beam is used, thermionic emission type lanthanum hexaboride ($LaB_6$) and tantalum (Ta) may be used as an electron gun. 10 Moreover, when the electron beam is used, the reticle R may be used, or the reticle R not used and a pattern may be formed directly on the wafer. Furthermore, high frequency such as a YAG laser or a semiconductor laser may be used.

The magnification of the projection optical system PL may involve not only a reduction system but may also involve an equal magnification or enlarging system. As the projection optical system PL, when a far-ultraviolet ray such as an excimer laser is used, a material which transmits the far-ultraviolet ray, such as quartz or fluorite, is used as the glass material, and when an $F_2$ laser or X-ray is used, a reflection/refraction system or a refraction system is used as the optical system (also for the reticle, one of a reflection type is used), or when an electron beam is used, an electronic optical system consisting of an electron lens and a deflector may be used as the optical system. Here, needless to say, the optical path along which the electron beam passes is evacuated. The invention is also applicable to a proximity exposure apparatus wherein the projection optical system PL is not used, and the reticle R and the wafer are brought into close contact with each other, to expose a pattern of the reticle R.

When a linear motor is used for the wafer stage 5 and the reticle stage 2 (see U.S. Pat. No. 5,623,853 or U.S. Pat. No. 5,528,118), either of an air floating type using an air bearing or a magnetic floating type using Lorentz force or reactance force may be used. Moreover, the respective stages 2 and 5 may be of a type which moves along a guide, or a guideless type without a guide.

As the drive for the respective stages 2 and 5, a planar motor may be used wherein a magnetic unit in which magnets are arranged two-dimensionally (permanent magnet) and an armature unit in which coils are arranged two-dimensionally are made to face each other, and the respective stages 2 and 5 are driven by an electromagnetic force. In this case, either the magnetic unit or the armature unit may be connected to the stages 2 and 5, and the other of the magnetic unit and the armature unit may be provided on the moving plane side (base) of the stages 2 and 5.

As described above, the exposure apparatus 1 of the embodiment of this application is manufactured by assembling various sub-systems including respective constituents mentioned in the claims of this application, so as to maintain a predetermined mechanical precision, electrical precision and optical precision. To ensure these various precisions, there are performed adjustment for obtaining the optical precision with respect to various optical systems, adjustments for obtaining the mechanical precision with respect to various mechanical systems and adjustments for obtaining the electrical precision with respect to various electric systems, before and after assembly. The assembly process from various sub-systems to the exposure apparatus includes mechanical connection, wiring connection of electric circuits and piping connection of pneumatic circuits between various sub-systems. Prior to the assembly process from the various sub-systems to the exposure apparatus, there is, of course, an assembly process of each sub-system. After the assembly process from the various sub-systems to the exposure apparatus has been completed, comprehensive adjustment is performed, to thereby ensure various precisions for the overall exposure apparatus. In addition, it is desirable that the production of the exposure apparatus be performed in a clean room wherein the temperature, the degree of cleanness and the like are controlled.

Figure 25:
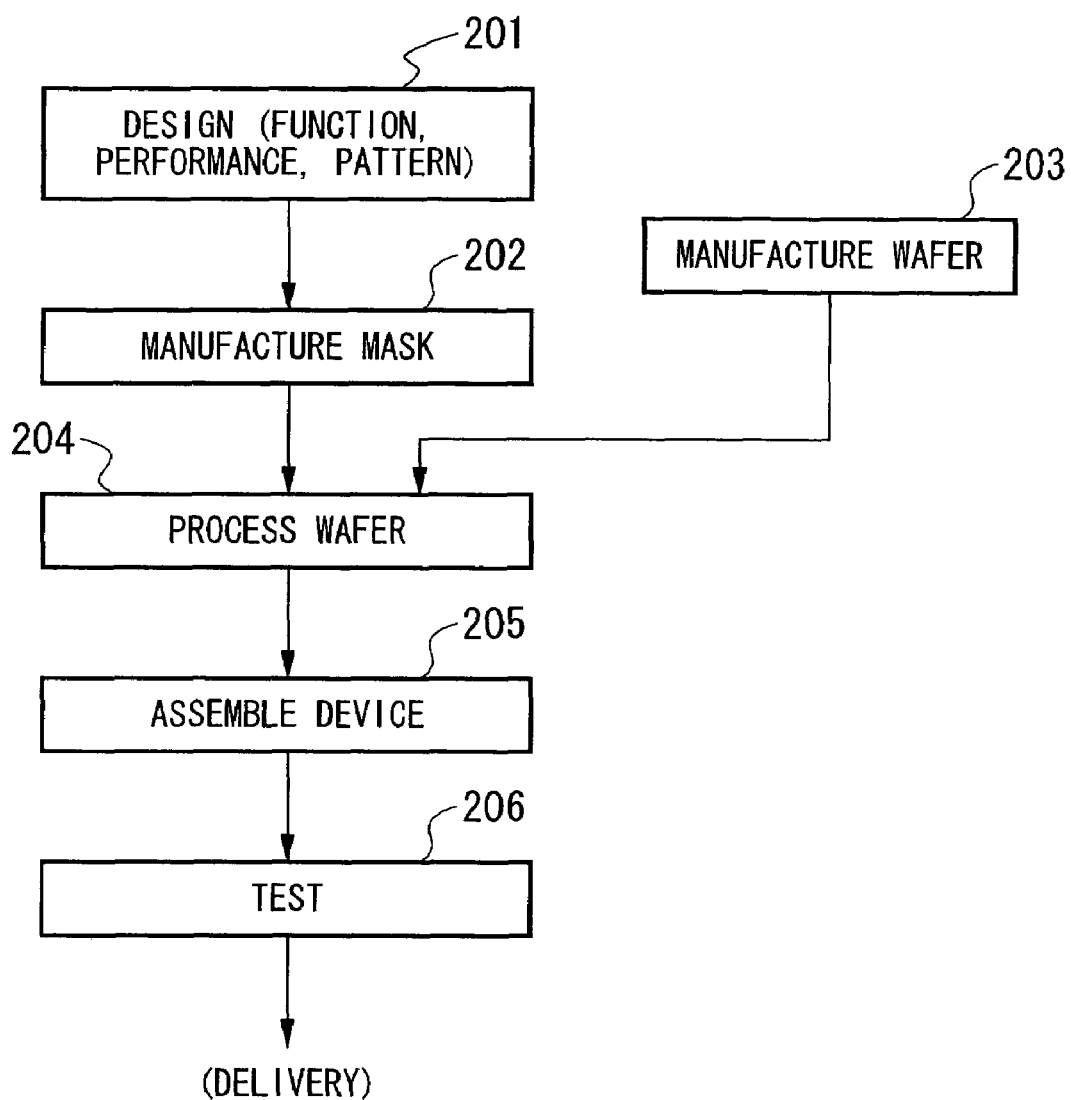
FIG. 25 is a flowchart for explaining one example of a semiconductor device manufacturing process.
Figure 26:
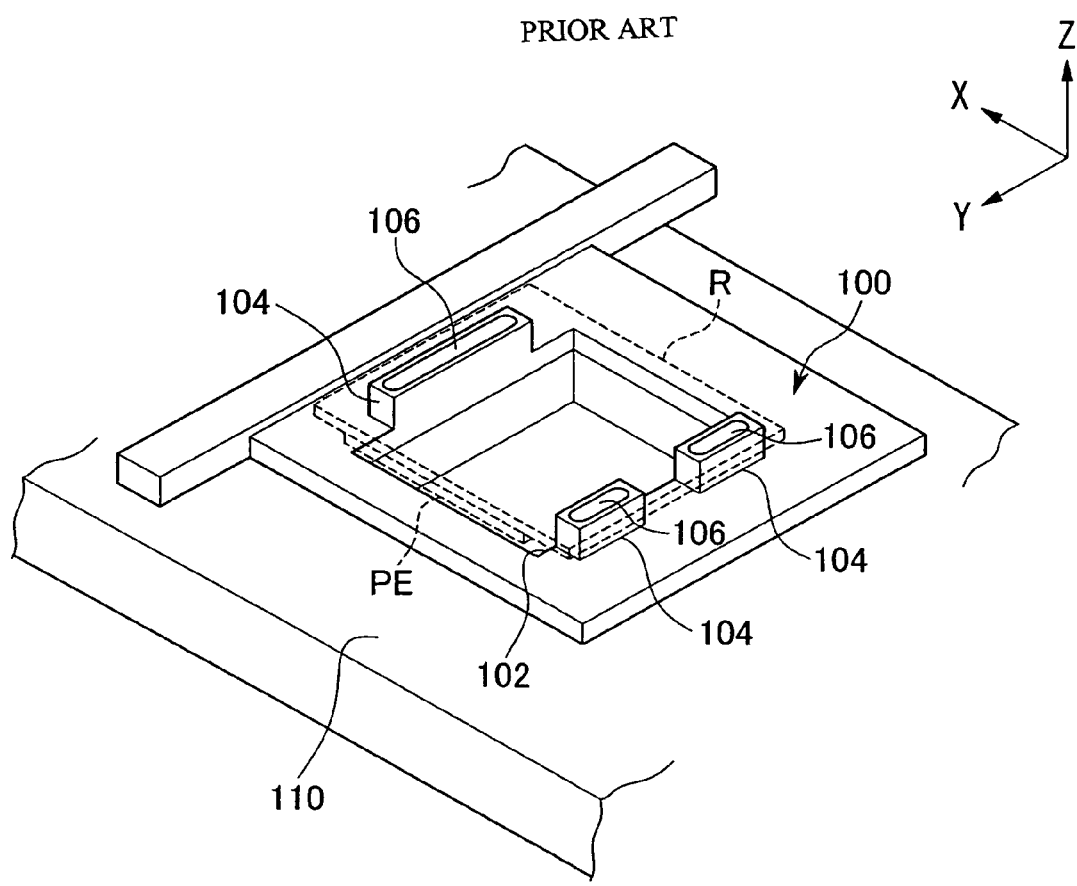
FIG. 26 is a perspective drawing of a conventional holding apparatus.

A semiconductor device is manufactured, as shown in FIG. 25, through steps such as a step 201 for designing the function and performance of the device, a step 202 for producing masks (reticles) based on the designing step, a step 203 for producing wafers from a silicon material, a substrate processing step 204 for exposing a pattern of a reticle on a wafer by means of the exposure apparatus in the above described embodiment, a device assembly step (including dicing step, bonding step and packaging step) 205, and an inspection step 206.

Second Embodiment

FIG. 15 to FIG. 21 illustrate a second embodiment of the present invention. This embodiment has a feature in that a so-called pin and chuck holder is used as a reticle holder 90. Other configuration of the apparatus is the same as that of the first embodiment described above.

Figure 15:
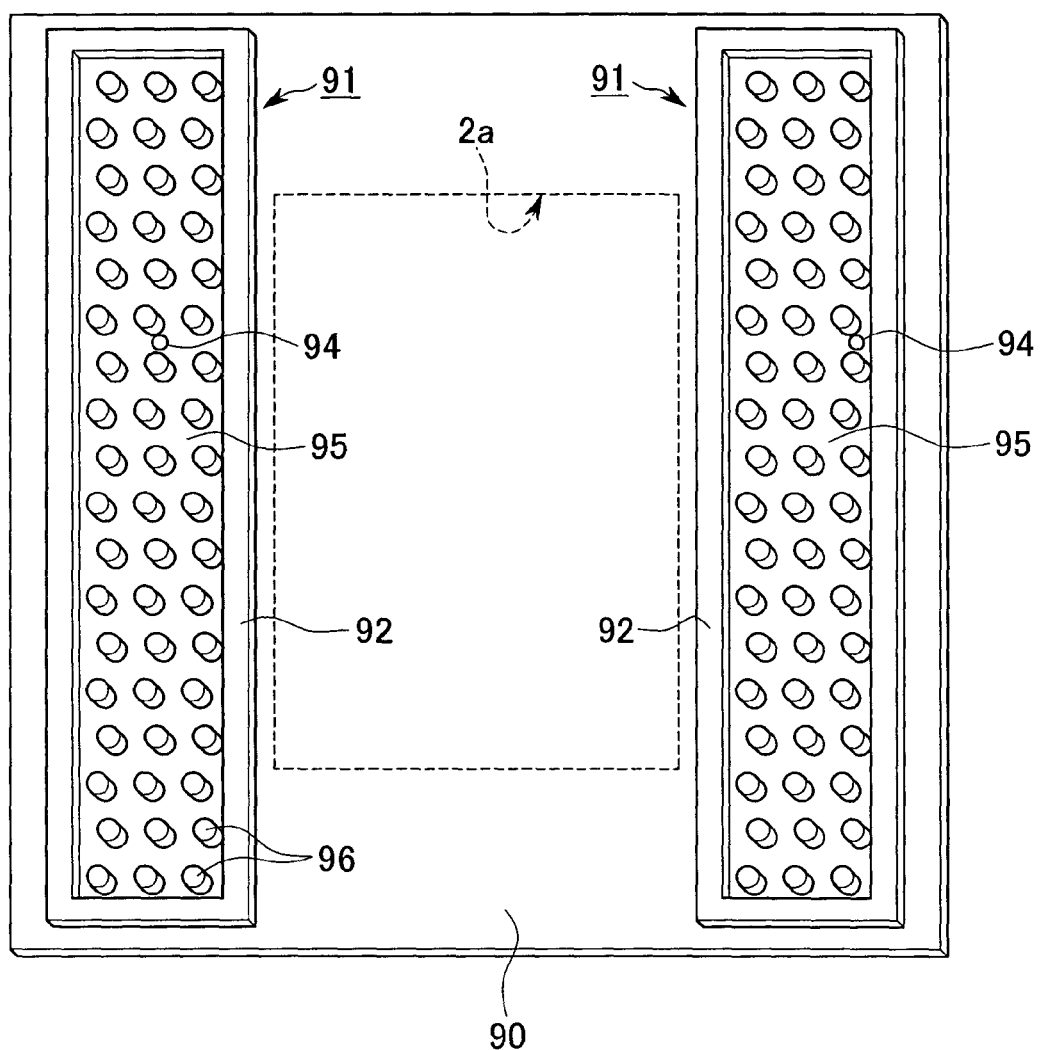
FIG. 15 is a perspective view illustrating another embodiment of the holding apparatus of the present invention.

FIG. 15 is a perspective view of the reticle holder 90. A rectangular opening 2a is formed at the center of the reticle holder 90, and suction pads 91 having a long and slender rectangular shape are formed on the opposite sides of the opening 2a on the upper face of the reticle holder 90, each aligned along the side of the opening 2a.

These suction pads 91 have, respectively, a partition wall 92 which surrounds a rectangular decompression area 95 for maintaining the degree of vacuum, a plurality of pins 96 formed in the decompression area 95, with intervals therebetween, and exhaust holes 94 which open into the decompression area 95. The width and height of the partition wall 92 are constant over the whole periphery, and the upper end faces of the partition wall 92 and the pins 96 are polished from the upper face of the holder, so as to have the same height precisely. An error in the height of the partition wall 92 and the pins 96 can be generally suppressed to 50 nm or below. Ceramics is the most suitable material for the reticle holder 90. The exhaust holes 94 are connected to a vacuum line (not shown), so as to be able to exhaust the gas in the decompression area 95.

Figure 16:
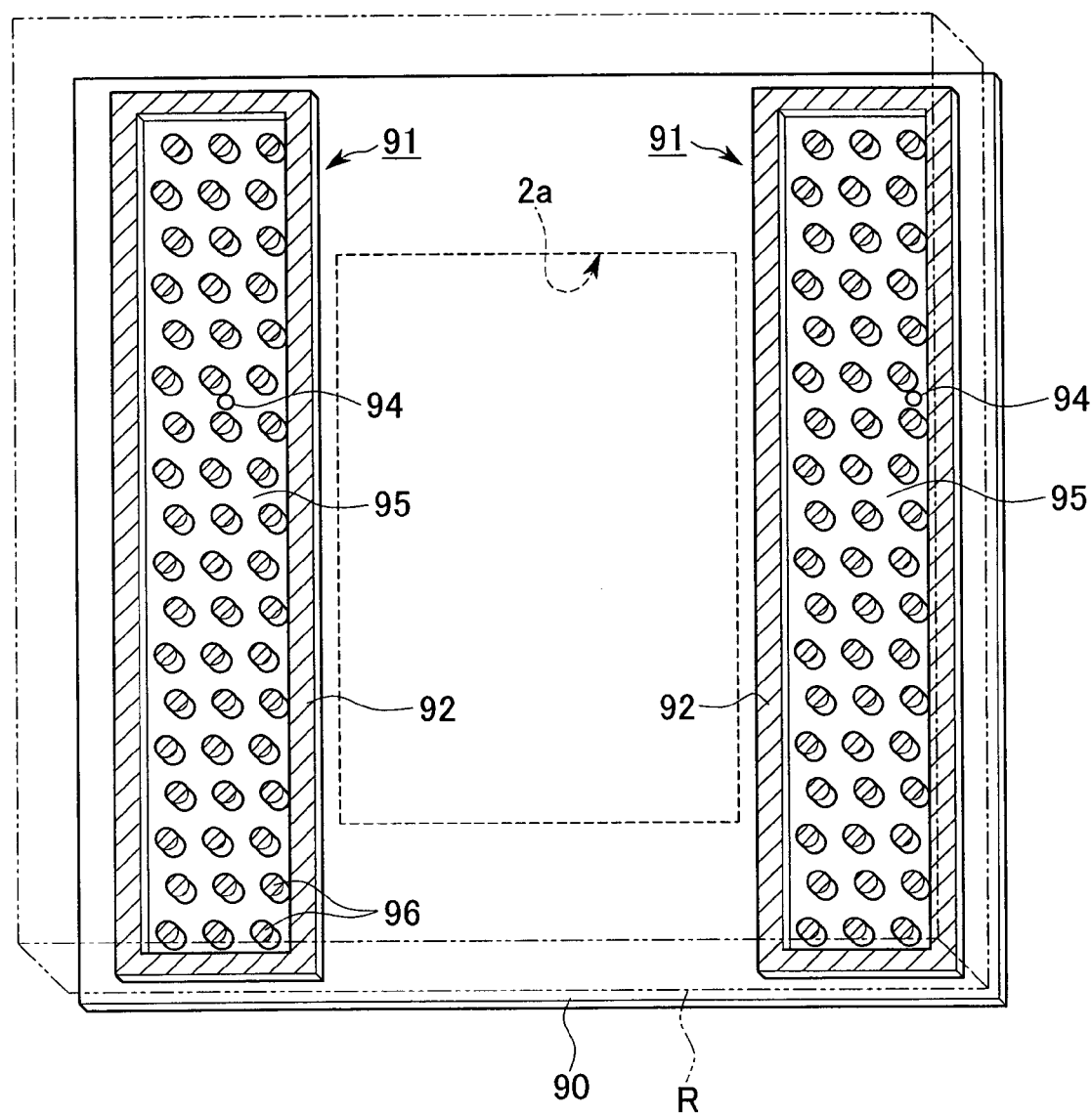
FIG. 16 is a perspective view showing a state with a reticle being attracted, in the embodiment.

FIG. 16 shows the reticle R attracted by the reticle holder 90, and the contact portion between the reticle R and the suction pads is shown by hatching.

When such a reticle holder 90 is used, the same effects as those of the above described embodiment can be obtained. This point will be described with reference to FIG. 17 to FIG. 21.

Figure 17:
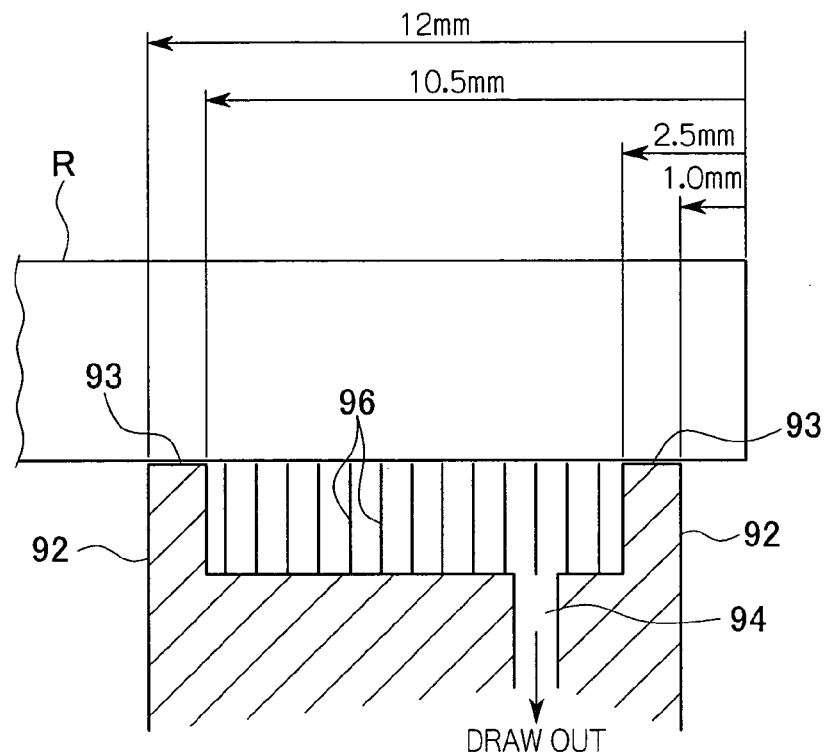
FIGS. 17 to 21 are enlarged sectional views of the main part, when the mask is held by the holding apparatus of the present invention.

FIG. 17 is an enlarged sectional view illustrating a case where a reticle R whose end is not tapered is attracted by the reticle holder 90, wherein the upper end face (attracting face) of the partition wall 92 is arranged at a position of from 1 to 2.5 mm and from 10.5 to 12 mm from the edge of the reticle R, to form a sealing portion.

Figure 18:
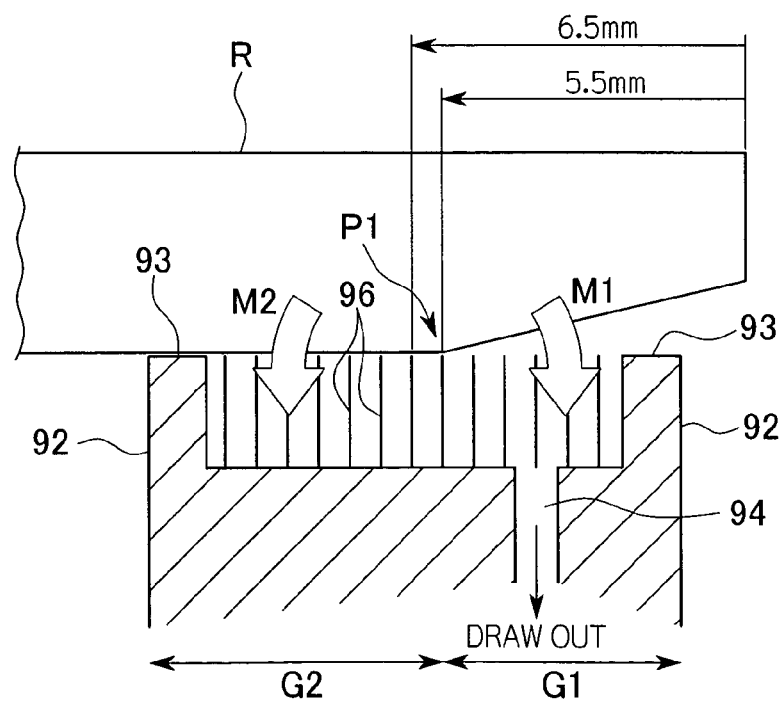

FIG. 18 shows a case where the outside of the position of 5.5 mm from the edge of the reticle R is tapered, as an embodiment of the present invention. The center between the partition walls 92 of the respective suction pads 91 in the reticle holder 90 is located at a position of 6.5 mm from the edge of the reticle R. In this case, a starting point P1 of the taper is located outside of the center between the partition walls 92 of the respective suction pads 91 in the reticle holder 90. Therefore, a moment M2 about a point P1 generated due to decompression in the decompression area 95 is larger than a moment M1 in the other direction, and hence a moment which causes peeling of the portion G further inside the reticle than the point P1, from the suction pad 91 is not generated.

Figure 19:
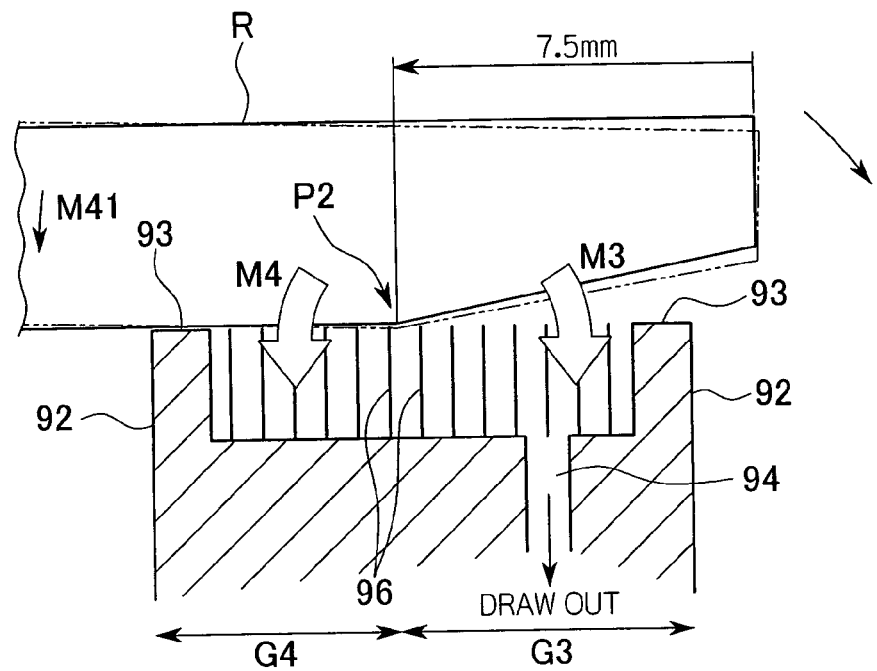

On the other hand, as shown in FIG. 19, when a taper starting point P2 of the reticle R is set to a position of 7.5 mm from the edge of the reticle, a moment M4 about a point P1 generated due to decompression in the decompression area 95 becomes smaller than a moment M3 in the other direction, and hence a moment which causes peeling of the portion G further inside the reticle than the point P1, from the suction pad 91 is generated. However, since the other end of the reticle R is attracted by the other suction pad 91, a bending moment works on the reticle R, and a counter moment M41 against this bending moment is generated. As a result, the moments M41, M4 and M3 are balanced, and the reticle R is distorted.

Figure 20:
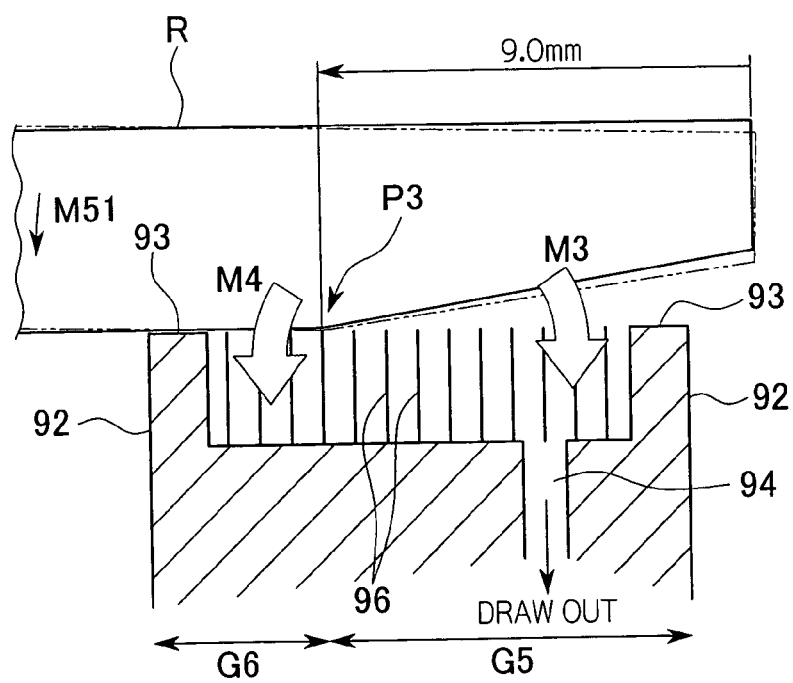
Figure 21:
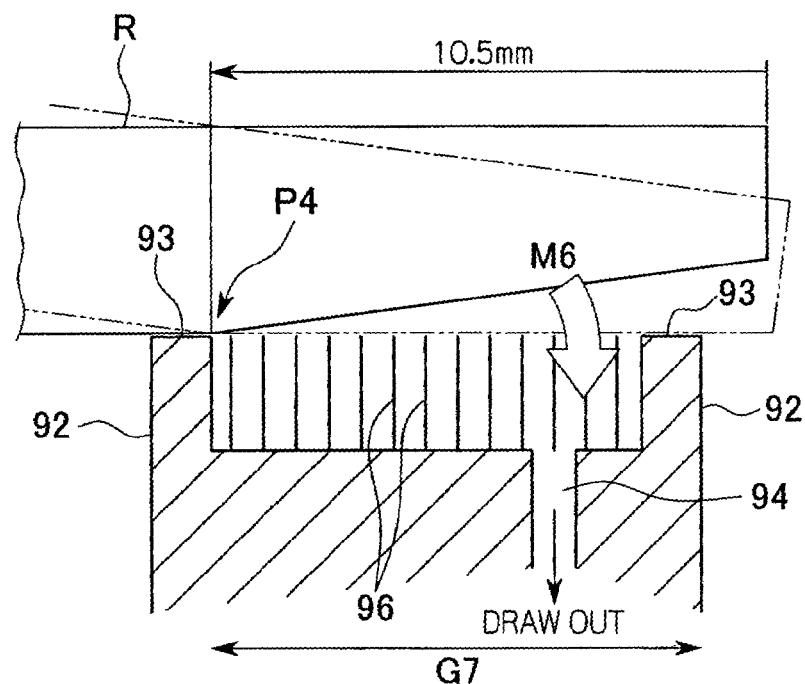

As shown in FIG. 20, when a taper starting point P3 of the reticle R is set to a position of 9 mm from the edge of the reticle, the moment M3 in a direction distorting the reticle R further increases, and as shown in FIG. 21, when a taper starting point P4 is located on the upper end face of the inside partition wall 92, the distorted quantity of the reticle R becomes largest.

As described above, in the second embodiment, since the pin and chuck type reticle holder 90 is used, the taper starting point of the reticle R needs only to be outside of the center in the width direction of the suction pad 91, as with the taper starting point P1 shown in FIG. 18. For example, when the center between the partition walls 92 of the respective suction pads 91 in the reticle holder 90 is located at a position of 6.5 nm from the edge of the reticle R, the deformation of the attracted reticle can be kept to a minimum, by combining with a reticle with the taper starting from outside of the position of 6 mm from the edge. Moreover, since a plurality of pins 96 comes in contact with the reticle, there is the effect of increasing a static frictional force between the reticle holder 90 and the reticle.

Third Embodiment

In the present invention, by placing a reticle R with the end of the reticle R being curved, as shown in FIG. 23 and FIG. 24, instead of forming the tapered portion at the end of the reticle R, a similar effect can be obtained. This point will be described below.

Figure 22:
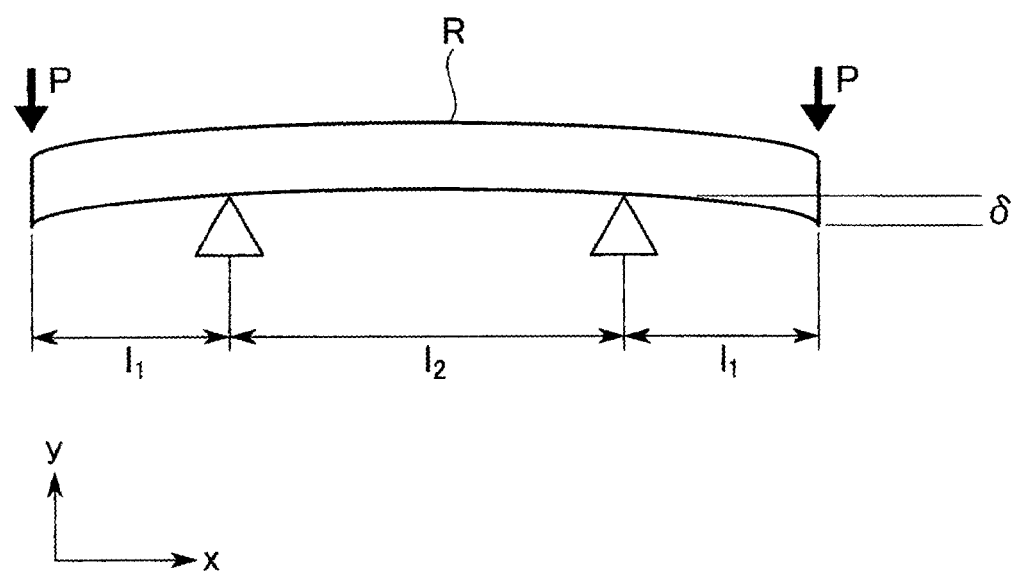

As shown in FIG. 22, when a stress P is applied perpendicularly to the upper face of the reticle, at the opposite ends of a flat reticle R having a uniform thickness, at a position of distance x from one end of the reticle R, a stress, a shearing force, a bending moment and flexure expressed by the following equations occur, where $l_1$ denotes an interval between a central supporting point and an outside supporting point of the reticle R in the attraction holding section (first attraction holding section) of the reticle holder, $l_2$ denotes an interval between the central supporting points in the respective attraction holding sections, $\delta$ denotes an interval (gap) between the outside supporting point and the reticle R, which is generated when the reticle R is mounted on the central supporting point, P denotes a product of the atmospheric pressure and an attraction area of the attraction holding section, E denotes a modulus of longitudinal elasticity of the reticle R, and I denotes a geometrical moment of inertia of the reticle R.

(Reaction Force: $R_1$, $R_2$)
$R_1 = R_2 = P$ (Shearing Force: Q)
When $0 < x < l_1$, $Q = -P_1$
When $l_1 < x < l_1 + l_2$, $Q = 0$
When $l_1 + l_2 < x < 2l_1 + l_2$, $Q = P_1$ (Bending Moment: M)
When $0 < x < l_1$, $M = -Px$
(when $x = 0$, $M = 0$, and when $x = l_1$, $M = -Pl_1$)
When $l_1 < x < l_1 + l_2$, $M = -Px + P(x - l_1) = -Pl_1$
When $l_1 + l_2 < x < 2l_1 + l_2$, $M = -P(2l_1 + l_2 - x)$
(when $x = l_1 + l_2$, $M = -Pl_1$, and when $x = 2l_1 + l_2$, $M = 0$)

(Flexure)

$$\text{With respect to } 0 \leq x \leq l_1, \frac{d^2 y}{dx^2} = -\frac{M}{EI} = \frac{Px}{EI} \quad (1)$$

$$\therefore \frac{dy}{dx} = \frac{Px^2}{2EI} + C_1 \quad (2)$$

$$\therefore y = \frac{Px^2}{6EI} + C_1 x + C_2 \quad (3)$$

$$\text{With respect to } l_1 \leq x \leq l_1 + l_2, \frac{d^2 y}{dx^2} = \frac{Pl_1}{EI} \quad (4)$$

$$\therefore \frac{dy}{dx} = \frac{Pl_1}{2EI} x + C_3 \quad (5)$$

$$\therefore y = \frac{Pl_1}{2EI} x^2 + C_3 x + C_4 \quad (6)$$

With respect to $l_1 + l_2 \leq x \leq 2l_1 + l_2$, $M = -P(2l_1 + l_2 - x)$, and hence, if it is assumed that $x' = 2l_1 + l_2 - x$, $M = -Px'$ $$\frac{d^2 y}{dx^2} = \frac{d^2 y}{dx'^2} = \frac{Px'}{EI} \quad (7)$$

$$\therefore \frac{dy}{dx'} = \frac{Px'^2}{2EI} + C_5 \quad (8)$$

$$\therefore y = \frac{Px'^3}{6EI} + C_5 x' + C_6 \quad (9)$$

The boundary conditions are:

$$[equ.(2)]_{x=l_1} = [equ.(5)]_{x=l_1} \quad (10)$$

$$[equ.(3)]_{x=l_1} = 0 \quad (11)$$

$$[equ.(6)]_{x=l_1} = 0 \quad (12)$$

Since the opposite side is also symmetrical, $$[equ.(5)]_{x=l_1+\frac{l_2}{2}} = 0 \quad (13)$$

$$c_1 = c_5 \quad (14)$$

$$c_2 = c_6 \quad (15).$$

From the above,
when $0 \leq x \leq l_1$, $$y = \frac{Px^3}{6EI} - \frac{Pl_1(l_1+l_2)}{2EI}x + \frac{Pl_1^2(2l_1+3l_2)}{6EI} \quad (16)$$

when $l_1 \leq x \leq l_1 + l_2$, $$y = \frac{Pl_1}{2EI}x^2 - \frac{Pl_1(2l_1+l_2)}{2EI}x + \frac{Pl_1^2(l_1+l_2)}{2EI} \quad (17)$$

and when $l_1 + l_2 \leq x \leq 2l_1 + l_2$, $$y = \frac{P}{6EI}(2l_1+l_2-x)^3 - \frac{Pl_1(l_1+l_2)}{2EI}(2l_1+l_2-x) + \frac{Pl_1^2(2l_1+3l_2)}{6EI} \quad (18)$$

Since a section at the time of x=0 is the bending quantity, when $0 \leq x \leq l_1$, $$\delta = \frac{Pl_1^2(2l_1+3l_2)}{6EI}$$

$$\therefore P = \frac{6EI\delta}{l_1^2(2l_1+3l_2)}. \quad (20)$$

From equations (20) and (16), $$y = \frac{\delta}{l_1^2(2l_1+3l_2)}x^3 + \frac{3\delta(l_1+l_2)}{l_1^2(2l_1+3l_2)} + \delta \quad (21)$$

When $l_1 \leq x \leq l_1 + l_2$,
from equations (20) and (17), $$y = \frac{3\delta}{l_1(2l_1+3l_2)}x^2 + \frac{3\delta(2l_1+l_2)}{l_1(2l_1+3l_2)}x + \frac{3\delta(l_1+l_2)}{2l_1+3l_2} \quad (22)$$

When $l_1 + l_2 < x < 2l_1 + l_2$,
from equations (20) and (18), $$y = \frac{\delta}{l_1^2(2l_1+3l_2)}(2l_1+l_2-x)^3 + \frac{3\delta(l_1+l_2)}{l_1(2l_1+3l_2)}(2l_1+l_2-x) + \delta. \quad (23)$$

The equations (21), (22) and (23) indicate deformations of the reticle due to the stress P. Therefore, if the shape of the reticle in the state with no stress applied is the shape expressed by the equation (21), (22) or (23), the reticle can be corrected to have a complete plane by applying the stress P on the opposite side, as shown in FIG. 23.

As shown in FIG. 23, when supporting portions ①, ①' and ②, ②' are provided, deformation is terminated at the point in time when the surface to be attracted of the reticle comes in contact with the supporting portions ①, ①' and ②, ②'. Therefore, it is not always necessary to satisfy equation (20), and it is only necessary to satisfy equation (24) described below. However, it is necessary that δ is in the form expressed by equation (21), (22) or (23).

$$\delta < \frac{Pl_1^2(2l_1+3l_2)}{6EI} \quad (24)$$

Since a vacuum chuck is normally used for holding the reticle, the stress P has a value obtained by multiplying the atmospheric pressure by the attraction area. Normally, the area of the interval $l_1$ between the supporting points is the attraction area.

Moreover, since the frictional force is important in the reticle holder for the scanning type exposure apparatus, the reticle holder is designed to have a large attraction area. A preferable design example in this case is shown in FIG. 24. The supporting points ③, ③' are provided outside of the supporting points ②, ②', and the attraction area is increased respectively by the area $l_3$ from ② to ③ and ②' to ③'. As a result, larger attraction and frictional force can be obtained.

The peripheral part of the reticle such as the area $l_3$ has normally poor flatness, and if the supporting point is brought into contact with these areas $l_3$, the reticle R bends largely. Therefore, it is necessary to avoid contact therebetween. For example, as with the reticle shape indicated by the dotted line in FIG. 24, a taper is provided at the end of the reticle R, and machining may be performed so that the surface to be attracted of the reticle after attraction shown by the solid line is away from the supporting points ③, ③'. This clearance (set back amount) h is preferably not larger than 5 μm. Since the surface precision in the area $l_3$ is rough, as compared with the surface precision in the area $l_2$ (normally not larger than 500 nm), machining of the area $l_3$ is easy.

When the state shown in FIG. 24 is explained by using a general expression, the shape of the precision warrantable area $l_4$ on the attracted surface of the reticle satisfies the relations expressed by equations (21), (22). (23) and (24), and a following equation (25) should be satisfied at the supporting points ③, ③'.

$$\text{When} - l_3 = x \text{ or} \quad (25)$$

$$x = 2l_1 + l_2 + l_3$$

$$y < \frac{\delta}{l_1^2(2l_1+3l_2)}(-l_3)^3 + \frac{3\delta(l_1+l_2)}{l_1(2l_1+3l_2)}(-l_3) + \delta$$

A similar effect can be obtained by shaving the portions corresponding to the supporting points ③, ③' by about 5 μm in depth, instead of making the area $l_3$ on the surface to be attracted of the reticle set back. Moreover, it is also possible to make both the area $l_3$ on the surface to be attracted of the reticle and the portions corresponding to the supporting points ③, ③' set back, respectively.

In the first and the second embodiments, after the reticle is attracted and held, the pattern face of the reticle slightly bends due to gravity (self weight). However, since this quantity can be calculated beforehand, the curvature of field occurring due to bending of the pattern face of the reticle can be corrected, by driving a movable lens group in the projection optical system.

According to the holding method of the present invention, the first area having predetermined surface precision and the second area other than the first area, of the surface to be attracted, can be respectively attracted and held separately by the first holding section and the second holding section. As a result, the first holding section can stably hold a sample without deteriorating the overall surface precision of the sample, and the second holding section can increase the whole surface of the sample to be attracted, thereby enabling stable retention.

What is claimed is:

1. A mask holding method for holding a mask in which a surface to be attracted has a convex shape towards a first direction within a predetermined allowable range, with a pair of first attraction holding sections arranged opposing the first direction, wherein the mask is held so as to satisfy the following relational expression:

$$\delta < Pl_1^2(2l_1+3l_2)/6EI$$

where $l_1$ respectively denotes an interval between a central supporting point and an outside supporting point of the mask in the respective first attraction holding sections, $l_2$ denotes an interval between the central supporting points in the respective first attraction holding sections, $\delta$ denotes an interval between the outside supporting point and the mask, which is generated when the mask is mounted on the central supporting point, P denotes a product of the atmospheric pressure and an attraction area of the first attraction holding section, E denotes a modulus of longitudinal elasticity of the mask, and I denotes a geometrical moment of inertia of the mask.

2. A mask holding method according to claim 1, wherein a surface precision warrantable area in the mask attraction surface is held using the first attraction holding section, and other than the surface precision warrantable area is held by the second attraction holding section.

3. A mask holding method according to claim 2, wherein after attracting the mask using the first attraction holding section, the mask is held so as to have a predetermined gap between the second attraction holding section and the mask.

4. A mask holding apparatus which holds a mask in which a surface to be attracted has a convex shape towards a first direction within a predetermined allowable range, with a pair of first attraction holding sections arranged opposing the first direction, wherein the first attraction holding sections are respectively arranged so as to satisfy the following relational expression:

$$\delta < Pl_1^2(2l_1+3l_2)/6EI$$

where $l_1$ respectively denotes an interval between a central supporting point and an outside supporting point of the mask in the respective first attraction holding sections, $l_2$ denotes an interval between the central supporting points in the respective first attraction holding sections, $\delta$ denotes an interval between the outside supporting point and the mask, which is generated when the mask is mounted on the central supporting point, P denotes a product of the atmospheric pressure and an attraction area of the first attraction holding section, E denotes a modulus of longitudinal elasticity of the mask, and I denotes a geometrical moment of inertia of the mask.

5. A mask holding apparatus according to claim 4, wherein a surface precision warrantable area in the mask attraction surface is held using the first attraction holding section, and further having a second attraction holding section which holds other than the surface precision warrantable area.

6. A mask holding apparatus according to claim 5, wherein after attracting the mask using the first attraction holding section, the mask is held so as to have a predetermined gap between the second attraction holding section and the mask.

7. A holding apparatus which holds a flat sample, comprising:
    a holding section which is connected to a suction apparatus and attracts a peripheral part of the sample to hold the sample; wherein
    the holding section attracts a first area of the peripheral part which has a predetermined surface precision and a second area of the peripheral part which is formed on an outside of the first area and has a different surface precision from the predetermined surface precision so as to suppress deformation of the sample.

8. A holding apparatus according to claim 7, wherein the holding section has a plurality of holding sections with respect to the peripheral part.

9. A holding apparatus according to claim 8, wherein the holding section has a first holding section facing the first area and a second holding section facing the second area.

10. A holding apparatus according to claim 9, wherein
    the first holding section has a first suction section connected to the suction apparatus, and
    the second holding section has a second suction section connected to the suction apparatus.

11. A holding apparatus according to claim 10, wherein
    the second holding section is arranged adjacent to the first holding section and on the outside of the first holding section, and
    a boundary portion between the first holding section and the second holding section faces the first area.

12. A holding apparatus according to claim 10, further comprising a control apparatus which is connected to the first suction section and the second suction section and separately controls an amount of gas suctioned per unit time by the first suction section and an amount of gas suctioned per unit time by the second suction section.

13. A holding apparatus according to claim 12, wherein the amount of gas suctioned per unit time by the first suction section is set greater than the amount of gas suctioned per unit time by the second suction section.

14. A holding apparatus according to claim 9, wherein an area of the first holding section with respect to the first area is set larger than an area of the second holding section with respect to the second area.

15. A holding apparatus according to claim 8, wherein
    the holding section has a partition wall surrounding a decompression area and a plurality of pin members arranged on an inside of the decompression area, and
    the partition wall has a first holding section facing the first area and a second holding section facing the second area.

16. A holding apparatus according to claim 15, wherein
    the second area is formed in a direction away from the holding section towards an outer portion of the sample from the first area, and
    the holding section holds the sample such that a boundary portion between the first area and the second area is arranged on the outside of a center of the first holding section and the second holding section.

17. A holding apparatus according to claim 16, wherein
the first area contacts the first holding section, and
the second area is set to have a predetermined distance from the second holding section.

18. A holding apparatus according to claim 7, wherein the second area is formed in a direction away from the holding section towards an outer portion of the sample from the first area.

19. A holding apparatus according to claim 7, wherein
the sample is a mask having a pattern, and
the first area has an area in which the pattern is formed.

20. An exposure apparatus which exposes a pattern of a mask held by a mask holder onto a substrate held by a substrate holder, wherein the holding apparatus according to claim 7 is used for at least one of the mask holder and the substrate holder.

21. A device manufacturing method incorporating a lithography process, wherein the exposure apparatus according to claim 20 is used in the lithography process.

22. A holding apparatus which holds a flat sample, comprising:
a holding section which is connected to a suction apparatus and attracts a peripheral part of the sample to hold the sample; wherein
the holding section attracts a first area of the peripheral part which has a central portion of the sample and a second area of the peripheral part which is formed in a direction away from the holding section towards an outer portion of the sample from the first area.

23. A holding apparatus according to claim 22, wherein the holding section has a plurality of holding sections with respect to the peripheral part.

24. A holding apparatus according to claim 23, wherein the holding section has a first holding section facing the first area and a second holding section facing the second area.

25. A holding apparatus according to claim 24, wherein
the first holding section has a first suction section connected to the suction apparatus, and
the second holding section has a second suction section connected to the suction apparatus.

26. A holding apparatus according to claim 25, wherein
the second holding section is arranged adjacent to the first holding section and on the outside of the first holding section, and
a boundary portion between the first holding section and the second holding section faces the first area.

27. A holding apparatus according to claim 25, further comprising a control apparatus which is connected to the first suction section and the second suction section and separately controls an amount of gas suctioned per unit time by the first suction section and an amount of gas suctioned per unit time by the second suction section.

28. A holding apparatus according to claim 27, wherein the amount of the gas suctioned per unit time by the first suction section is set greater than the amount of the gas suctioned per unit time by the second suction section.

29. A holding apparatus according to claim 24, wherein an area of the first holding section with respect to the first area is set larger than an area of the second holding section with respect to the second area.

30. A holding apparatus according to claim 22, wherein
the holding section has a partition wall surrounding a decompression area and a plurality of pin members arranged on an inside of the decompression area, and
the partition wall has a first holding section facing the first area and a second holding section facing the second area.

31. A holding apparatus according to claim 30, wherein
the holding section holds the sample such that a boundary portion between the first area and the second area is arranged on the outside of a center of the first holding section and the second holding section.

32. A holding apparatus according to claim 31, wherein
the first area contacts the first holding section, and
the second area is set to have a predetermined distance from the second holding section.

33. A holding apparatus according to claim 22, wherein
the sample is a mask having a pattern, and
the first area has an area in which the pattern is formed.

34. An exposure apparatus which exposes a pattern of a mask held by a mask holder onto a substrate held by a substrate holder, wherein the holding apparatus according to claim 22 is used for at least one of the mask holder and the substrate holder.

35. A device manufacturing method incorporating a lithography process, wherein the exposure apparatus according to claim 34 is used in the lithography process.

36. A holding method for holding a flat sample, comprising:
providing the sample which has a peripheral part having a first area which has a predetermined surface precision and a second area which is formed on an outer side of the sample relative to the first area and has a different surface precision from the predetermined surface precision;
attracting the first area and the second area so as to suppress deformation of the sample; and
holding the sample by a holding section which attracts the first area and the second area.

37. A holding method according to claim 36, wherein the holding section has a plurality of holding sections with respect to the peripheral part.

38. A holding method according to claim 36, wherein the second area is formed in a direction away from the holding section towards the outer side of the sample from the first area.

39. A holding method according to claim 36, wherein
the holding section has a first holding section facing the first area and a second holding section facing the second area,
the first area contacts the first holding section, and
the second area is set to have a predetermined distance from the second holding section.

40. A holding method according to claim 36, wherein
the sample is a mask having a pattern, and
the first area has an area in which the pattern is formed.

41. A holding method for holding a flat sample by a holding section, comprising:
providing the sample which has a peripheral part having a first area which has a central portion of the sample and a second area which is formed in a direction away from the holding section towards an outer portion of the sample from the first area;
attracting the first area and the second area so as to suppress deformation of the sample; and
holding the sample by a holding section which attracts the first area and the second area.

42. A holding method according to claim 41, wherein the holding section has a plurality of holding sections with respect to the peripheral part.

43. A holding method according to claim 41, wherein the second area is formed in a direction away from the holding section towards the outer portion of the sample from the first area.

44. A holding method according to claim 41, wherein the holding section has a first holding section facing the first area and a second holding section facing the second area, the first area contacts the first holding section, and
the second area is set to have a predetermined distance from the second holding section.

45. A holding method according to claim 41, wherein the sample is a mask having a pattern, and
the first area has an area in which the pattern is formed.

* * * * *